(12) United States Patent
Lee et al.

(10) Patent No.: US 12,199,118 B2
(45) Date of Patent: Jan. 14, 2025

(54) IMAGE SENSOR HAVING PIXELS WITH DIFFERENT LIGHT RECEIVING AREAS

(71) Applicant: SAMSUNG ELECTRONICS CO., LTD., Suwon-si (KR)

(72) Inventors: Dong Kyu Lee, Suwon-si (KR); Dong Min Keum, Daegu (KR); Jun Sung Park, Hwaseong-si (KR); Bum Suk Kim, Hwaseong-si (KR); Tae Han Kim, Hwaseong-si (KR); Kwang Hee Lee, Hwaseong-si (KR); Tae Sung Lee, Hee (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 540 days.

(21) Appl. No.: 17/483,266

(22) Filed: Sep. 23, 2021

(65) Prior Publication Data

US 2022/0216257 A1    Jul. 7, 2022

(30) Foreign Application Priority Data

Jan. 4, 2021    (KR) .................. 10-2021-0000109

(51) Int. Cl.
*H01L 27/146*    (2006.01)

(52) U.S. Cl.
CPC .... *H01L 27/14621* (2013.01); *H01L 27/1461* (2013.01); *H01L 27/14627* (2013.01)

(58) Field of Classification Search
CPC ........... H01L 27/14621; H01L 27/1461; H01L 27/14627; H01L 27/14612; H01L 27/14636; H01L 27/14645; H01L 27/14605; H01L 27/14607; H01L 27/1464; H04N 23/84; H04N 25/11

USPC ...................................................... 250/208.1
See application file for complete search history.

(56) References Cited

U.S. PATENT DOCUMENTS

| | | | |
|---|---|---|---|
| 9,319,646 B2 | 4/2016 | Masagaki | |
| 9,571,763 B2 | 2/2017 | Funatsu et al. | |
| 9,634,049 B2 | 4/2017 | Chang et al. | |
| 10,204,946 B1 | 2/2019 | Boettiger et al. | |
| 10,319,761 B2 | 6/2019 | Sugizaki | |
| 10,784,300 B1* | 9/2020 | Lin .................. H01L 27/1462 | |
| 2018/0286895 A1* | 10/2018 | Watanabe ......... H01L 27/14612 | |
| 2019/0052823 A1* | 2/2019 | Jung .................... H04N 25/76 | |
| 2019/0335110 A1 | 10/2019 | Kobayashi et al. | |

(Continued)

FOREIGN PATENT DOCUMENTS

KR    10-2019-0017197 A    2/2019
WO    WO-2020230675 A1 *    11/2020    ............... G02B 7/34

*Primary Examiner* — Thanh Luu
*Assistant Examiner* — Mai Thi Ngoc Tran
(74) *Attorney, Agent, or Firm* — Sughrue Mion, PLLC

(57) ABSTRACT

An image sensor includes a substrate including a first surface on which light is incident and a second surface opposite to the first surface, unit pixels in the substrate, each including a photoelectric conversion layer, color filters on the first surface of the substrate, a grid pattern on the first surface of the substrate defining a respective light receiving area of each of the unit pixels, and microlenses on the color filters, each of the microlenses corresponding to a respective one of the unit pixels, wherein the unit pixels include a first pixel and a second pixel sharing a first color filter which is one of the color filters, and a first light receiving area of the first pixel is different from a second light receiving area of the second pixel.

18 Claims, 23 Drawing Sheets

(56) References Cited

U.S. PATENT DOCUMENTS

| | | | | |
|---|---|---|---|---|
| 2020/0043962 A1* | 2/2020 | Cho | ................... | H01L 27/14627 |
| 2020/0227455 A1* | 7/2020 | Lee | ................... | H01L 27/14685 |
| 2021/0202546 A1* | 7/2021 | Liu | ..................... | H01L 27/1463 |

* cited by examiner

IMAGE SENSOR HAVING PIXELS WITH DIFFERENT LIGHT RECEIVING AREAS

CROSS-REFERENCE TO RELATED APPLICATION

This application is based on and claims priority under 35 U.S.C. § 119 to Korean Patent Application No. 10-2021-0000109 filed on Jan. 4, 2021 in the Korean Intellectual Property Office, the disclosure of which is incorporated by reference herein in its entirety.

BACKGROUND

1. Technical Field

The disclosure relates to an image sensor. More particularly, the disclosure relates to a complementary metal oxide semiconductor (CMOS) image sensor.

2. Description of the Related Art

An image sensor, as a semiconductor device, converts optical information into electrical signals. Examples of the image sensor may include a charge coupled device (CCD) image sensor and a complementary metal oxide semiconductor (CMOS) image sensor.

The image sensor may be configured in the form of a package and, in this case, the package may have a structure allowing light to be incident on a light receiving surface or sensing area while protecting the image sensor.

Recently, research has been conducted on a backside illumination (BSI) image sensor in which incident light is irradiated through a rear surface of a semiconductor substrate so that pixels formed in the image sensor can have improved light receiving efficiency and light sensitivity.

SUMMARY

Aspects of the disclosure provide an image sensor with improved quality.

In accordance with an aspect of the disclosure, an image sensor includes a substrate including a first surface on which light is incident and a second surface opposite to the first surface; a plurality of unit pixels in the substrate, each of the plurality of unit pixels including a respective photoelectric conversion layer; a plurality of color filters on the first surface of the substrate; a grid pattern on the first surface of the substrate, the grid pattern defining a respective light receiving area of each of the plurality of unit pixels; and a plurality of microlenses on the plurality of color filters, each of the plurality of microlenses corresponding to a respective one of the plurality of unit pixels, wherein the plurality of unit pixels includes a first pixel and a second pixel sharing a first color filter of the plurality of color filters, and wherein a first light receiving area of the first pixel is different from a second light receiving area of the second pixel.

In accordance with an aspect of the disclosure, an image sensor includes a light receiving region in which a plurality of unit pixels are arranged; a first color filter on a substrate; a first merged pixel including a first group of unit pixels sharing the first color filter among the plurality of unit pixels; and a grid pattern defining a respective light receiving area of each of the first group of unit pixels across the first color filter, wherein the first merged pixel includes a first pixel and a second pixel farther than the first pixel from a center of the light receiving region, and wherein a first light receiving area of the first pixel is smaller than a second light receiving area of the second pixel.

In accordance with an aspect of the disclosure, an image sensor includes a plurality of unit pixels in a substrate; a first color filter on the substrate; a first merged pixel including a first group of unit pixels sharing the first color filter among the plurality of unit pixels; and a grid pattern defining a respective light receiving area of each of the plurality of unit pixels across the first color filter, wherein the first merged pixel includes a first central pixel and a plurality of first peripheral pixels surrounding the first central pixel, and wherein a light receiving area of each of the plurality of first peripheral pixels is smaller than a light receiving area of the first central pixel.

However, aspects of the disclosure are not restricted to the one set forth herein. The above and other aspects of the disclosure will become more apparent to one of ordinary skill in the art to which the disclosure pertains by referencing the detailed description of the disclosure given below.

BRIEF DESCRIPTION OF THE DRAWINGS

The above and other aspects, features, and advantages of certain embodiments of the disclosure will become more apparent from the following description taken in conjunction with the accompanying drawings, in which.

DETAILED DESCRIPTION OF THE EMBODIMENTS

It will be understood that when an element or layer is referred to as being "over," "above," "on," "below,"

"under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the disclosure.

Hereinafter, image sensors according to example embodiments will be described with reference to FIGS. 1 to 23.

Figure 1:
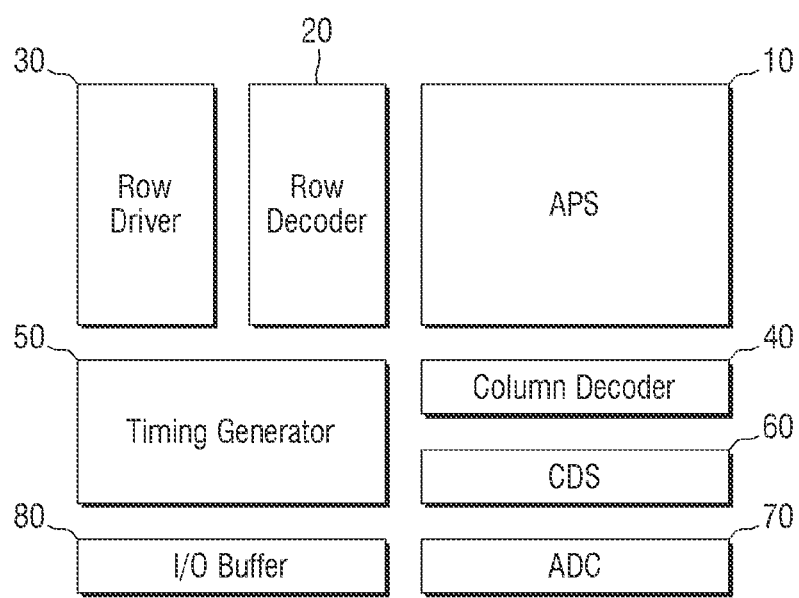
FIG. 1 is an example block diagram illustrating an image sensor according to some embodiments.
Figure 2:
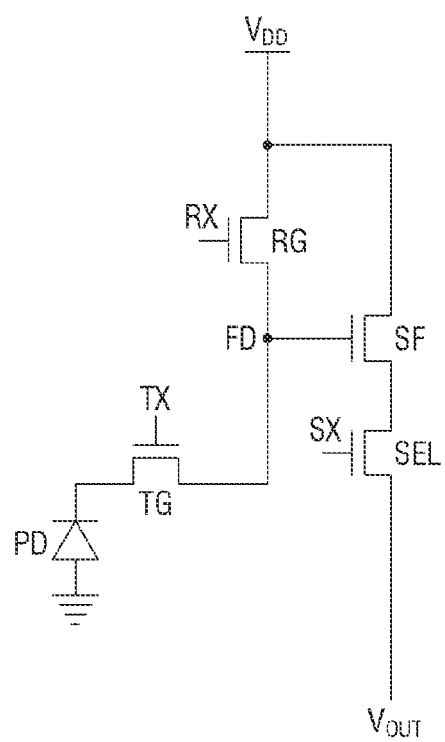
FIG. 2 is an example circuit diagram explaining a unit pixel of an image sensor according to some embodiments.

FIG. 1 is an example block diagram illustrating an image sensor according to some embodiments. FIG. 2 is an example circuit diagram explaining a unit pixel of an image sensor according to some embodiments.

Referring to FIG. 1, the image sensor according to some embodiments may include an active pixel sensor array (APS) 10, a row decoder 20, a row driver 30, a column decoder 40, a timing generator 50, a correlated double sampler (CDS) 60, an analog-to-digital converter (ADC) 70, and an input/output (I/O) buffer 80.

The APS 10 may include a plurality of unit pixels arranged two-dimensionally and may convert an optical signal into an electrical signal. The APS 10 may be driven by driving signals such as a pixel selection signal, a reset signal, and a charge transfer signal received from the row driver 30. Further, the electrical signal converted by the APS 10 may be provided to the CDS 60.

The row driver 30 may provide the APS 10 with a plurality of driving signals to drive a plurality of unit pixels according to the decoding result of the row decoder 20. When the unit pixels are arranged in a matrix, driving signals may be provided for each row.

The timing generator 50 may provide a timing signal and a control signal to the row decoder 20 and the column decoder 40.

The CDS 60 may receive the electrical signal generated by the APS 10, and may hold and sample the received signal. The CDS 60 may double-sample a certain noise level and a signal level according to the electrical signal, and may output a difference level corresponding to a difference between the noise level and the signal level.

The ADC 70 may convert an analog signal corresponding to the difference level outputted from the CDS 60 into a digital signal, and may output the digital signal.

The I/O buffer 80 may latch digital signals, and the latched signals may be sequentially outputted as the digital signals to an image signal processor according to the decoding result of the column decoder 40.

Referring to FIG. 2, each of the unit pixels may include a photoelectric conversion element PD, a transfer transistor TG, a floating diffusion region FD, a reset transistor RG, a source follower transistor SF, and a select transistor SEL.

The photoelectric conversion element PD may generate electric charges in proportion to an amount of light incident from the outside. The photoelectric conversion element PD may be coupled with the transfer transistor TG that transfers the generated and accumulated charges to the floating diffusion region FD. The floating diffusion region FD converts the charges into a voltage, and has a parasitic capacitance so that the charges can be stored cumulatively.

One end of the transfer transistor TG may be connected to the photoelectric conversion element PD, and the other end of the transfer transistor TG may be connected to the floating diffusion region FD. The transfer transistor TG may be formed of a transistor driven by a predetermined bias (e.g., a transfer signal TX). That is, the transfer transistor TG may transfer the charges generated from the photoelectric conversion element PD to the floating diffusion region FD in response to the transfer signal TX.

The source follower transistor SF may amplify a change in the electrical potential of the floating diffusion region FD that has received the charges from the photoelectric conversion element PD and output the amplified change to an output line VOUT. When the source follower transistor SF is turned on, a predetermined electrical potential, e.g., a power voltage VDD, provided to the drain of the source follower transistor SF, may be transferred to the drain region of the select transistor SEL.

The select transistor SEL may select a unit pixel to be read on a row basis. The select transistor SEL may be formed of a transistor driven by a select line through which a predetermined bias (e.g., a row select signal SX) is applied.

The reset transistor RG may periodically reset the floating diffusion region FD. The reset transistor RG may be formed of a transistor driven by a reset line through which a predetermined bias (e.g., a reset signal RX) is applied. When the reset transistor RG is turned on by the reset signal RX, a predetermined electrical potential, e.g., the power voltage VDD, provided to the drain of the reset transistor RG may be transferred to the floating diffusion region FD.

Figure 3:
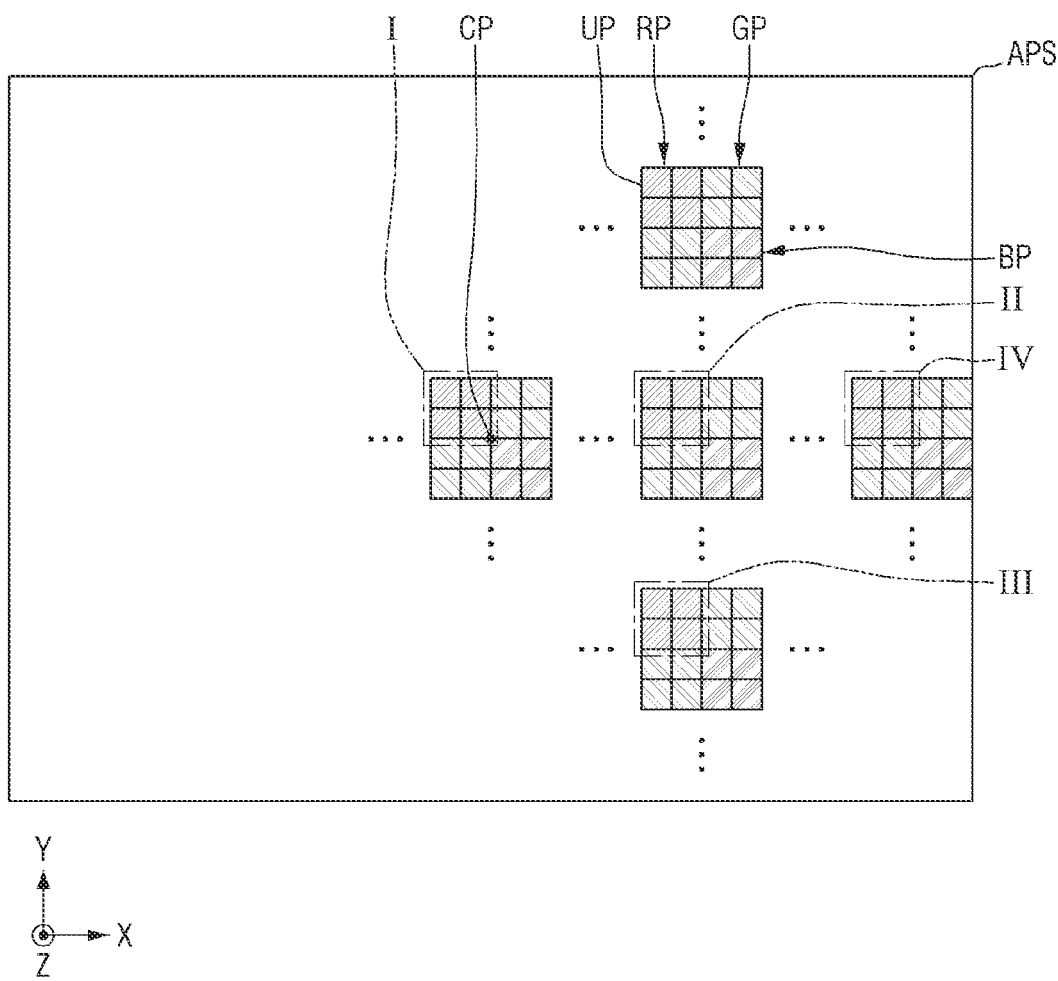
FIG. 3 is a schematic layout diagram of a light receiving region in an image sensor according to some embodiments.
Figure 4:
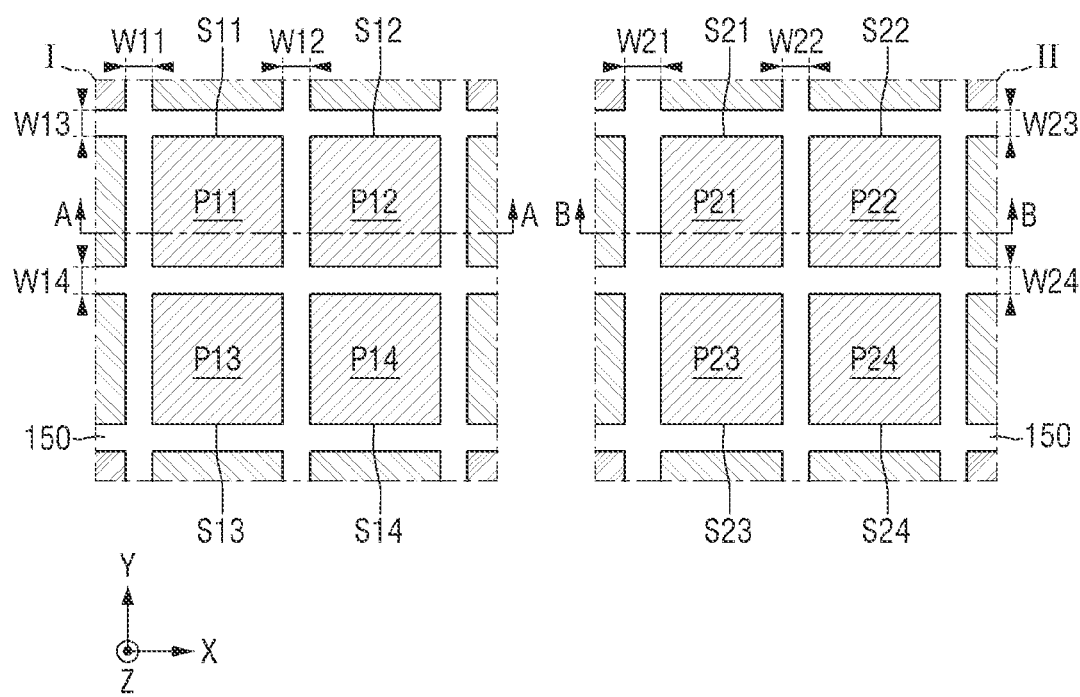
FIG. 4 is an example partial layout diagram illustrating a first region and a second region of FIG. 3.
Figure 5:
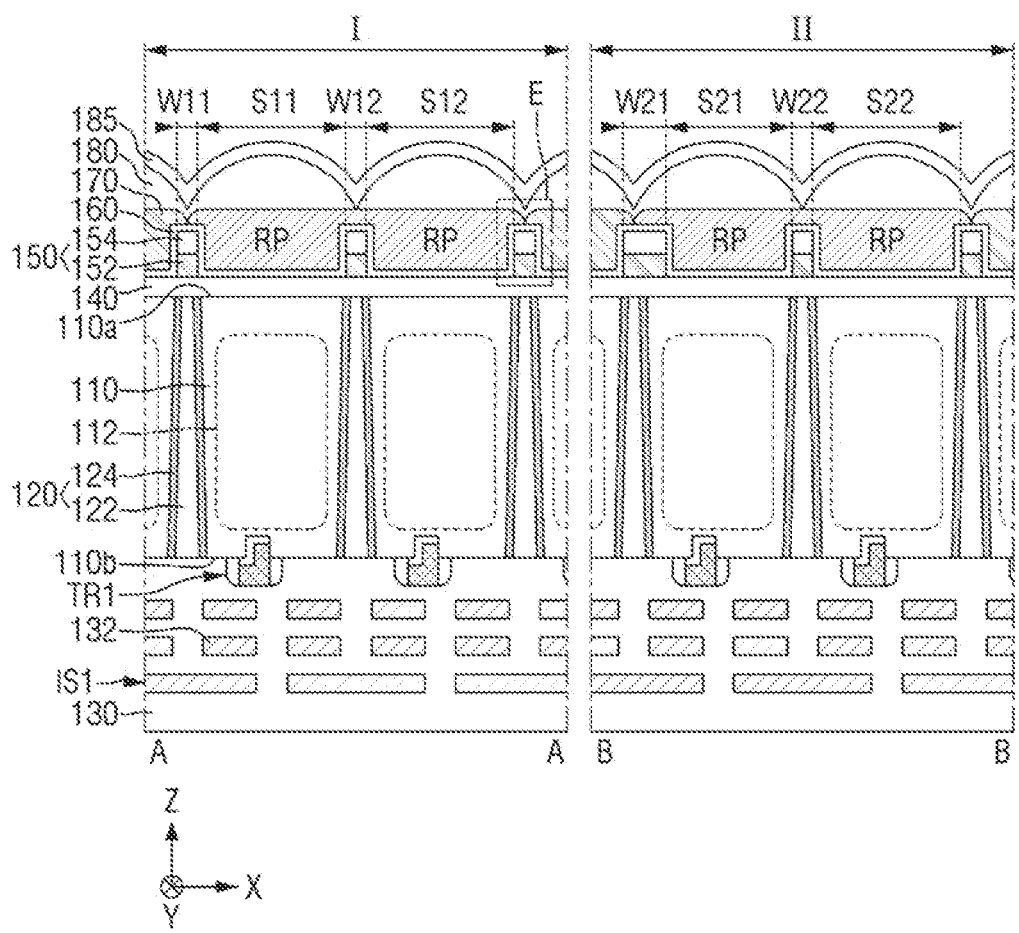
FIG. 5 is a cross-sectional view taken along lines A-A and B-B of FIG. 4.
Figure 6:
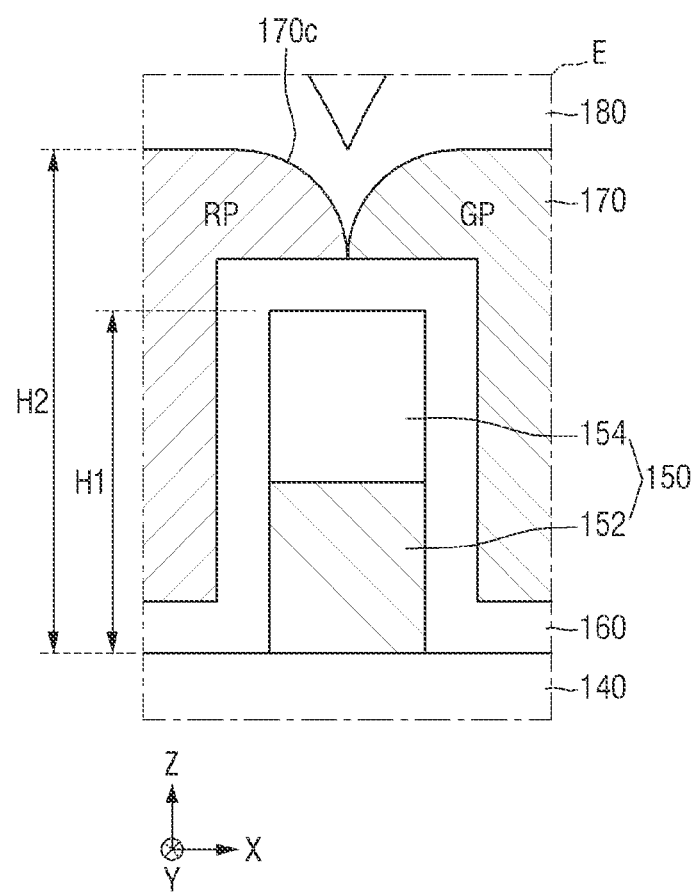
FIG. 6 is an enlarged view illustrating area E of FIG. 5.

FIG. 3 is a schematic layout diagram of a light receiving region in an image sensor according to some embodiments. FIG. 4 is an example partial layout diagram illustrating a first region and a second region of FIG. 3. FIG. 5 is a cross-sectional view taken along lines A-A and B-B of FIG. 4. FIG. 6 is an enlarged view illustrating area E of FIG. 5.

Referring to FIG. 3, the image sensor according to some embodiments includes a light receiving region APS.

A plurality of unit pixels UP that receive light and generate electrical signals may be disposed in the light receiving region APS. The unit pixels UP may be arranged two-dimensionally (e.g., in a matrix form) in a plane including a first direction X and a second direction Y. The active pixel sensor array 10 of FIG. 1 may include a region corresponding to the light receiving region APS.

The light receiving region APS may include a first region I to a fourth region IV. The first region I may include the unit pixels UP adjacent to a center CP of the light receiving region APS. The second region II may include the unit pixels UP that are farther than the first region I from the center CP of the light receiving region APS. For example, the second region II may be spaced apart from the first region I in the first direction X. The third region III may include the unit pixels UP that are spaced apart from the first region I in a diagonal direction. For example, the second region II may be spaced apart from the third region III in the second direction Y. The fourth region IV may include the unit pixels UP that are farther than the second region II from the center CP of the light receiving region APS. For example, the fourth region W may be spaced apart from the second region II in the first direction X.

Each of the unit pixels UP may generate an electrical signal by sensing a predetermined color. For example, each of the unit pixels UP may receive light passing through one of a first color filter RP, a second color filter GP, and a third color filter BP to generate an electrical signal.

The first color filter RP, the second color filter GP, and the third color filter BP may include a red color filter, a green color filter, and a blue color filter, respectively. However, this is merely example, and the first color filter RP, the second color filter GP, and the third color filter BP may include a yellow filter, a magenta filter, and a cyan filter, respectively, or may further include a white filter.

The first color filter RP, the second color filter GP, and the third color filter BP may filter different colors. As an example, the first color filter RP may be a red color filter, the second color filter GP may be a green color filter, and the third color filter BP may be a blue color filter.

In some embodiments, the first color filter RP, the second color filter GP, and the third color filter BP may be arranged in a Bayer pattern. For example, two second color filters GP may be arranged along a diagonal direction other than the first direction X and the second direction Y. The first color filter RP may be arranged along the first direction X together with one second color filter GP, and may be arranged along the second direction Y together with the other second color filter GP. In addition, the third color filter BP may be arranged along the second direction Y together with one second color filter GP, and may be arranged along the first direction X together with the other second color filter GP. The first color filter RP and the third color filter BP may be arranged along a diagonal direction other than the first direction X and the second direction Y.

In some embodiments, at least some adjacent unit pixels UP may form a merged pixel that shares one color filter. For example, four unit pixels UP arranged in a 2×2 array may share one of the first color filter RP, the second color filter GP, and the third color filter BP.

Referring to FIGS. 3 to 6, the image sensor according to some embodiments includes a first substrate 110, a photoelectric conversion layer 112, a pixel isolation pattern 120, a first electronic element TR1, a first wiring structure IS1, a surface insulating layer 140, a color filter 170, a grid pattern 150, and a microlens 180.

The first substrate 110 may be a semiconductor substrate. For example, the first substrate 110 may be a bulk silicon or silicon-on-insulator (SOI) substrate. The first substrate 110 may be a silicon substrate, or may include other materials such as silicon germanium, indium antimonide, lead tellurium compound, indium arsenide, indium phosphide, gallium arsenide, or gallium antimonide. Alternatively, the first substrate 110 may have an epitaxial layer formed on a base substrate.

The first substrate 110 may include a first surface 110a and a second surface 110b opposite to each other. In embodiments to be described later, the first surface 110a may be referred to as a back surface of the first substrate 110, and the second surface 110b may be referred to as a front surface of the first substrate 110. In some embodiments, the first surface 110a of the first substrate 110 may be a light receiving surface on which light is incident. That is, the image sensor according to some embodiments may be a backside illuminated (BSI) image sensor.

The photoelectric conversion layer 112 may be formed in the first substrate 110. The plurality of photoelectric conversion layers 112 may be arranged to correspond to the plurality of unit pixels UP such that each photoelectric conversion layer 112 corresponds to a respective unit pixel UP. For example, the photoelectric conversion layers 112 may be arranged two-dimensionally (e.g., in a matrix form) in a plane including the first direction X and the second direction Y and may be disposed in the unit pixels UP. The photoelectric conversion layer 112 may generate electric charges in proportion to an amount of light incident from the outside.

The photoelectric conversion layer 112 may be formed by doping impurities into the first substrate 110. For example, the photoelectric conversion layer 112 may be formed by ion-implanting n-type impurities into the first substrate 110 which is of a p-type. In some embodiments, the photoelectric conversion layer 112 may have a potential slope in a third direction Z crossing the surface (e.g., the first surface 110a or the second surface 110b) of the first substrate 110. For example, the impurity concentration of the photoelectric conversion layer 112 may decrease from the second surface 110b toward the first surface 110a.

The photoelectric conversion layer 112 may include, for example, at least one of a photodiode, a phototransistor, a photogate, a pinned photodiode, an organic photodiode, quantum dots, or a combination thereof, but is not limited thereto.

The pixel isolation pattern 120 may be formed in the first substrate 110. The pixel isolation pattern 120 may define the plurality of unit pixels UP in the first substrate 110. For example, the pixel isolation pattern 120 may be formed in a grid shape in plan view, and may surround each of the unit pixels UP arranged in a matrix form.

In some embodiments, the pixel isolation pattern 120 may penetrate the first substrate 110. For example, the pixel isolation pattern 120 may continuously extend from the second surface 110b of the first substrate 110 to the first surface 110a of the first substrate 110.

In some embodiments, the pixel isolation pattern 120 may have a width that decreases as it moves away from the second surface 110b of the first substrate 110. Here, the width means a width in a direction parallel to the surface (e.g., the first surface 110a or the second surface 110b) of the first substrate 110. This may be due to the characteristics of an etching process for forming the pixel isolation pattern 120. For example, a process of etching the first substrate 110 to form the pixel isolation pattern 120 may be performed on the second surface 110b of the first substrate 110.

In some embodiments, the pixel isolation pattern 120 may include a conductive filling pattern 122 and an insulating spacer layer 124. For example, an isolation trench defining the plurality of unit pixels UP may be formed in the first substrate 110. The insulating spacer layer 124 may extend along the side surface of the isolation trench. The conductive filling pattern 122 may be formed on the insulating spacer layer 124 to fill the remaining region of the isolation trench. The insulating spacer layer 124 may electrically insulate the conductive filling pattern 122 from the first substrate 110.

The conductive filling pattern 122 may include, for example, polysilicon (poly Si), but is not limited thereto. In some embodiments, a ground voltage or a negative voltage may be applied to the conductive filling pattern 122. In this case, an electrostatic discharge (ESD) bruise defect of the image sensor may be effectively prevented. Here, the ESD bruise defect refers to a phenomenon in which electric charges generated by ESD or the like are accumulated in the first substrate 110, causing spots such as bruises in a generated image.

The insulating spacer layer 124 may include, for example, at least one of silicon oxide, aluminum oxide, tantalum oxide, or a combination thereof, but is not limited thereto. In some embodiments, the insulating spacer layer 124 may include a low refractive index material having a lower refractive index than that of the first substrate 110. In this case, the insulating spacer layer 124 may refract or reflect light incident obliquely on the photoelectric conversion layer 112 to improve light collection efficiency, thereby improving the quality of the image sensor. Further, the insulating spacer layer 124 may prevent photocharges generated in a specific unit pixel UP by incident light from moving to adjacent unit pixels UP by random drift.

The first electronic element TR1 may be formed on the second surface 110b of the first substrate 110. The first electronic element TR1 may include various transistors for processing the electrical signals generated from the unit pixels UP. For example, the first electronic element TR1 may include transistors such as the transfer transistor TG, the reset transistor RG, the source follower transistor SF, or the select transistor SEL described above with reference to FIG. 2.

In some embodiments, the first electronic element TR1 may include a vertical transfer transistor. For example, the first electronic element TR1 including the above-described transfer transistor TG may partially extend into the first substrate 110. The transfer transistor TG may reduce the area of the unit pixel UP, thereby enabling high integration of the image sensor.

The first wiring structure IS1 may be formed on the second surface 110b of the first substrate 110. The first wiring structure IS1 may include one or a plurality of wires. For example, the first wiring structure IS1 may include a first inter-wire insulating layer 130 and a plurality of first wires 132 in the first inter-wire insulating layer 130. In FIG. 5, the arrangement and the number of layers of wires constituting the first wiring structure IS1 are merely examples, and the technical spirit of the disclosure is not limited thereto.

In some embodiments, the first wires 132 may be electrically connected to the unit pixels UP. For example, the first wire 132 may be connected to the first electronic element TR1.

The surface insulating layer 140 may be formed on the first surface 110a of the first substrate 110. The surface insulating layer 140 may extend along the first surface 11a of the first substrate 110. The surface insulating layer 140 may include, for example, at least one of silicon oxide, silicon nitride, silicon oxynitride, aluminum oxide, hafnium oxide, or a combination thereof, but is not limited thereto.

In some embodiments, the surface insulating layer 140 may be formed of multiple films. For example, the surface insulating layer 140 may include an aluminum oxide film, a hafnium oxide film, a silicon oxide film, a silicon nitride film, and a hafnium oxide film that are sequentially stacked on the first surface 110a of the first substrate 110.

The surface insulating layer 140 may function as an antireflection layer to prevent reflection of light incident on the first substrate 110. Accordingly, the light receiving rate of the photoelectric conversion layer 112 may be improved. In addition, the surface insulating layer 140 may function as a planarization layer to allow the color filters 170 and the microlenses 180, which will be described later, to be formed with a uniform height.

The color filter 170 may be formed on the first surface 110a of the first substrate 110. For example, the color filter 170 may be formed on the surface insulating layer 140. The plurality of color filters 170 may be arranged two-dimensionally (e.g., in a matrix form) in a plane including the first direction X and the second direction Y. For example, the color filter 170 may include the first color filter RP, the second color filter GP, and the third color filter BP described above with reference to FIG. 3.

Each of the first region I and the second region II may include a merged pixel that shares one of the plurality of color filters 170. As an example, the first region I may include a first merged pixel P11 to P14 (i.e., a first group of unit pixels) sharing the first color filter RP, and the second region II may include a second merged pixel P21 to P24 sharing the first color filter RP. However, this is merely an example, and each of the first merged pixel P11 to P14 and the second merged pixel P21 to P24 may share a different color filter. For example, the first merged pixel P11 to P14 may share the first color filter RP, and the second merged pixel P21 to P24 may share the second color filter GP or the third color filter BP other than the first color filter RP.

The grid pattern 150 may be formed on the first surface 110a of the first substrate 110. For example, the grid pattern 150 may be formed on the surface insulating layer 140. The grid pattern 150 may be formed in a grid shape in plan view and surround each of the unit pixels UP arranged in a matrix form. For example, the grid pattern 150 may be formed to overlap the pixel isolation pattern 120 in the third direction Z.

The grid pattern 150 may cross the color filter 170 from an edge to an opposite edge. For example, the grid pattern 150 may be formed in a grid shape in plan view and surround each of the color filters 170 arranged in a matrix form. In addition, as described above, since one color filter 170 may be shared by a plurality of unit pixels UP, the grid pattern 150 may cross the inside of one color filter 170.

The grid pattern 150 may define a light receiving area of each of the unit pixels UP. Herein, the light receiving area may mean an area in which light incident toward the first surface 110a of the first substrate 110 can pass through the grid pattern 150 in plan view. For example, as shown in FIG. 4, the grid pattern 150 may define light receiving areas S11 to S14 of the first merged pixel P11 to P14 and light receiving areas S21 to S24 of the second merged pixel P21 to P24. As the width of the grid pattern 150 increases, the light receiving areas S11 to S14 of the first merged pixel P11 to P14 and the light receiving areas S21 to S24 of the second merged pixel P21 to P24 may decrease.

The light receiving areas of the unit pixels UP included in the merged pixel may vary depending on positions where the unit pixels UP are disposed.

In some embodiments, the light receiving areas of at least some of the unit pixels UP may decrease as the unit pixels are farther away from the center CP of the light receiving region APS. For example, the light receiving areas S21 and S23 of the pixels P21 and P23 may be smaller than the light receiving areas S11 and S13 of the pixels P11 and P13. As an example, a width W21 of the grid pattern 150 defining the light receiving areas S21 and S23 on the left surfaces of the pixels P21 and P23 (i.e., a second portion of the grid pattern 150) may be greater than a width W11 of the grid pattern 150 defining the light receiving areas S11 and S13 on the left surfaces of the pixels P11 and P13 (i.e., a first portion of the grid pattern 150). A width W23 of the grid pattern 150 defining the light receiving areas S21 and S22 on the top surfaces of the pixels P21 and P22 may be the same as a width W13 of the grid pattern 150 defining the light receiving areas S11 and S12 on the top surfaces of the pixels P11 and P12. A width W24 of the grid pattern 150 defining the light receiving areas S23 and S24 on the top surfaces of the pixels P23 and P24 may be the same as a width W14 of the grid pattern 150 defining the light receiving areas S13 and S14 on the top surfaces of the pixels P13 and P14. The term "same" as used herein not only means being completely identical but also includes a minute difference that may occur due to a process margin and the like.

In some embodiments, the light receiving areas of at least some of the unit pixels UP included in the second merged pixel P21 to P24 may decrease as the unit pixels are closer to the center CP of the light receiving region APS. For example, the light receiving areas S21 and S23 of the pixels P21 and P23 may be smaller than the light receiving areas S22 and S24 of the pixels P22 and P24. For example, the width W21 of the grid pattern 150 defining the light receiving areas S21 and S23 on the left surfaces of the pixels P21 and P23 may be greater than a width W22 of the grid pattern 150 defining the light receiving areas S22 and S24 on the left surfaces of the pixels P22 and P24.

In some embodiments, the light receiving areas of the unit pixels UP included in the first merged pixel P11 to P14 may be the same. For example, the light receiving area S11 of the pixel P11, the light receiving area S12 of the pixel P12, the light receiving area S13 of the pixel P13, and the light receiving area S14 of the pixel P14 may be the same. As an example, the width W11 of the grid pattern 150 defining the light receiving areas S11 and S13 on the left surfaces of the pixels P11 and P13 may be the same as a width W12 of the grid pattern 150 defining the light receiving areas S12 and S14 on the left surfaces of the pixels P12 and P14. The width W13 of the grid pattern 150 defining the light receiving areas S11 and S12 on the top surfaces of the pixels P11 and P12 may be the same as the width W14 of the grid pattern 150 defining the light receiving area S13 and S14 on the top surfaces of the pixels P13 and P14.

In some embodiments, the grid pattern 150 may include a first material pattern 152 and a second material pattern 154 as shown, e.g., in FIG. 5. The first material pattern 152 and the second material pattern 154 may be sequentially stacked on the surface insulating layer 140. The first material pattern 152 and the second material pattern 154 may include different materials. As an example, the first material pattern 152 may be a metal pattern, and the second material pattern 154 may be an oxide pattern. As another example, the first material pattern 152 may be a first metal pattern, and the second material pattern 154 may be a second metal pattern different from the first metal pattern.

The metal pattern may include, for example, at least one of titanium (Ti), titanium nitride (TiN), tantalum (Ta), tantalum nitride (TaN), tungsten (W), aluminum (Al), copper (Cu) or a combination thereof, but is not limited thereto. In some embodiments, the first material pattern 152 including the metal pattern may prevent the electric charges generated by ESD or the like from being accumulated on the surface (e.g., the first surface 110a) of the first substrate 110, thereby effectively preventing the ESD bruise defect.

The oxide pattern may include, for example, at least one of metal oxide such as titanium oxide, tantalum oxide, tungsten oxide, aluminum oxide, copper oxide, silicon oxide, or a combination thereof, but is not limited thereto. In some embodiments, the second material pattern 154 may include a low refractive index material having a lower refractive index than that of silicon (Si). In this case, the second material pattern 154 may refract or reflect light incident obliquely on the photoelectric conversion layer 112 to improve light collection efficiency, thereby improving the quality of the image sensor.

In some embodiments, the height of the grid pattern 150 may be lower than the height of the color filter 170. For example, as shown in FIGS. 5 and 6, with respect to the top surface of the surface insulating layer 140, a height H1 of the top surface of the grid pattern 150 may be lower than a height H2 of the top surface of the color filter 170. For example, with respect to the top surface of the surface insulating layer 140, the height H1 of the top surface of the grid pattern 150 may be about 3000 Å to about 5000 Å, and the height H2 of the top surface of the color filter 170 may be about 5000 Å to about 10000 Å. In this case, the grid pattern 150 may not completely separate the color filters 170. For example, as illustrated, the first color filter RP and the second color filter GP may be in contact with each other on the top surface of the grid pattern 150.

In some embodiments, the height of the color filter 170 may decrease toward the edge of the color filter 170. For example, as shown in FIGS. 5 and 6, with respect to the top surface of the surface insulating layer 140, the height H2 of the top surface of the first color filter RP may decrease toward the second color filter GP. This may be due to the characteristics of a process for forming the color filter 170 on the grid pattern 150. In some embodiments, the edge of the color filter 170 may include a convex curved surface 170c. The height of the convex curved surface 170c of the first color filter RP may decrease toward the second color filter GP.

In some embodiments, a first passivation layer 160 may be further formed on the surface insulating layer 140 and the grid pattern 150. The first passivation layer 160 may conformally extend along the profiles of the top surface of the surface insulating layer 140 and the side and top surfaces of the grid pattern 150. The first passivation layer 160 may be interposed between the surface insulating layer 140 and the color filter 170 and between the grid pattern 150 and the color filter 170.

The first passivation layer 160 may prevent damage to the surface insulating layer 140 and the grid pattern 150. The first passivation layer 160 may include, for example, aluminum oxide, but is not limited thereto.

The microlens 180 may be formed above the first surface 110a of the first substrate 110. For example, the microlens 180 may be formed on the color filter 170. The plurality of microlenses 180 may be arranged to correspond to the plurality of unit pixels UP such that each microlens 180 corresponds to a respective unit pixel UP. For example, the plurality of microlenses 180 may be arranged two-dimensionally (e.g., in a matrix form) in a plane including the first direction X and the second direction Y.

The microlens 180 may have a convex shape and may have a predetermined radius of curvature. Accordingly, the microlens 180 may condense light incident on the photoelectric conversion layer 112. The microlens 180 may include, for example, a light transmitting resin, but is not limited thereto.

In some embodiments, a second passivation layer 185 may be formed on the microlens 180. The second passivation layer 185 may extend along the surface of the microlens 180. The second passivation layer 185 may include inorganic oxide. For example, the second passivation layer 185 may include at least one of silicon oxide, titanium oxide, zirconium oxide, hafnium oxide, or a combination thereof, but is not limited thereto. As an example, the second passivation layer 185 may include low temperature oxide (LTO).

The second passivation layer 185 may protect the microlens 180 from the outside. For example, the second passivation layer 185 including inorganic oxide may cover and protect the microlens 180 including an organic material such as a light transmitting resin. In addition, the second passivation layer 185 may improve the quality of the image sensor by improving light collection efficiency of the microlens 180. For example, the second passivation layer 185 may fill a space between the microlenses 180, thereby reducing reflection, refraction, scattering, and the like of incident light reaching the space between the microlenses 180.

In order to improve the performance of the image sensor, a merged pixel in which a plurality of adjacent unit pixels share one color filter is used. For example, the merged pixel has an advantage of being able to provide a bright image by operating as one pixel in a dark place of the image sensor, and provide a detailed image by being rearranged (re-mosaic) in a bright place of the image sensor.

Meanwhile, as the image sensor becomes increasingly highly integrated, there is a problem in that the sensitivity of each of the unit pixels constituting one merged pixel varies depending on its position. For example, in an electronic device including the image sensor, light incident from the outside may pass through a module lens and reach a light receiving region of the image sensor. In this case, the amount of light passing through the center portion of the module lens may be greater than the amount of light passing through the edge portion of the module lens. Accordingly, the sensitivities of the unit pixels adjacent to the center of the light receiving region among the unit pixels constituting one merged pixel may be greater than the sensitivities of the unit pixels away from the center of the light receiving region among the unit pixels constituting the one merged pixel. This difference in sensitivity causes a deterioration in the quality of an image generated when the merged pixel is rearranged (re-mosaic).

However, the image sensor according to some embodiments may improve the quality of a generated image by varying the light receiving areas depending on the positions of the unit pixels UP constituting the merged pixel. For example, as described above, in the second merged pixel P21 to P24, the light receiving areas S21 and S23 of the pixels P21 and P23 closer to the center CP of the light receiving region APS may be smaller than the light receiving areas S22 and S24 of the pixels P22 and P24 farther away from the center CP of the light receiving region APS. Accordingly, a difference in sensitivity between the pixels P21 and P23 and the pixels P22 and P24 may be reduced, thereby providing the image sensor with improved quality.

In addition, the above sensitivity difference between the unit pixels constituting one merged pixel may increase as the unit pixels are farther away from the center of the light receiving region. However, the image sensor according to some embodiments may improve the quality of a generated image by varying the light receiving areas depending on the positions of the merged pixels. For example, as described above, the light receiving areas S21 and S23 of the pixels P21 and P23 in the second merged pixel P21 to P24, which is away from the center CP of the light receiving region APS, may be smaller than the light receiving areas S11 and S13 of the pixels P11 and P13 in the first merged pixel P11 to P14, which is adjacent to the center CP of the light receiving region APS. Accordingly, the image sensor with improved quality may be provided.

Figure 7:
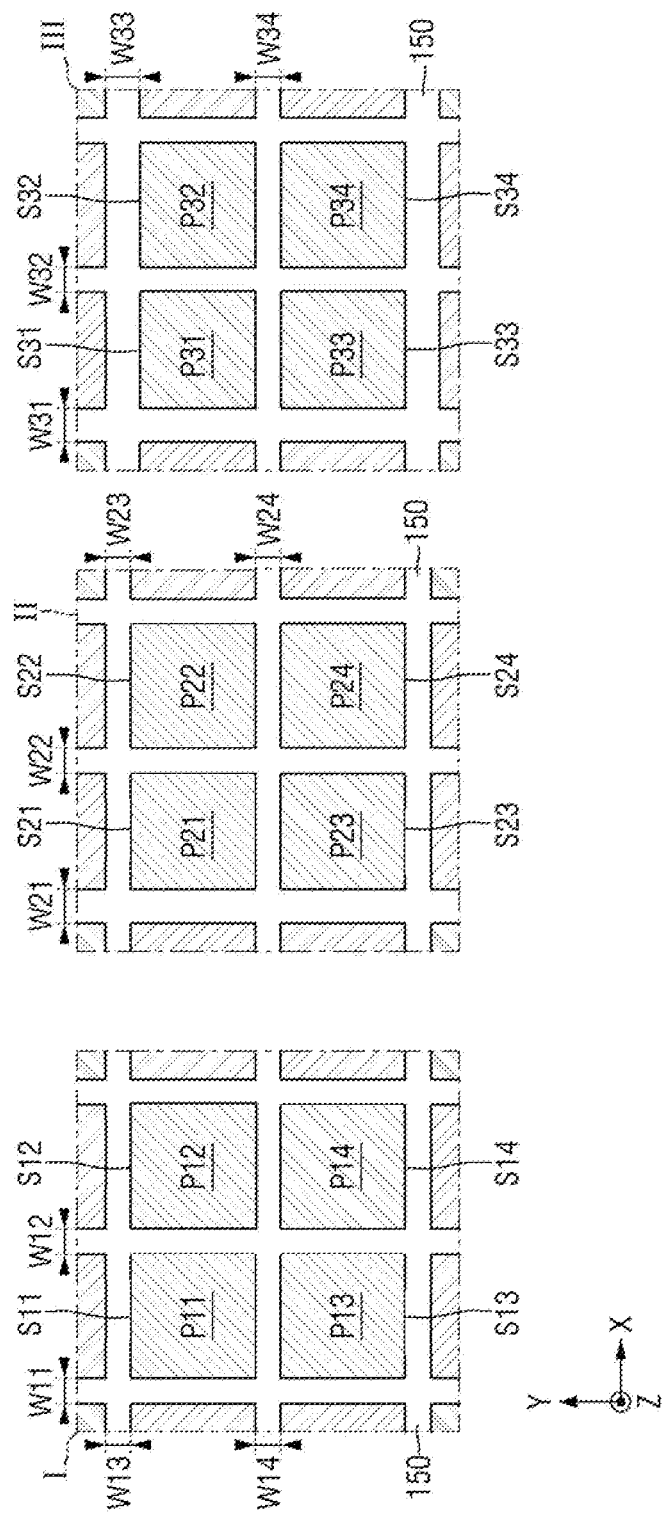
FIGS. 7 and 8 are various example partial layout diagrams illustrating first to third regions of FIG. 3.
Figure 8:
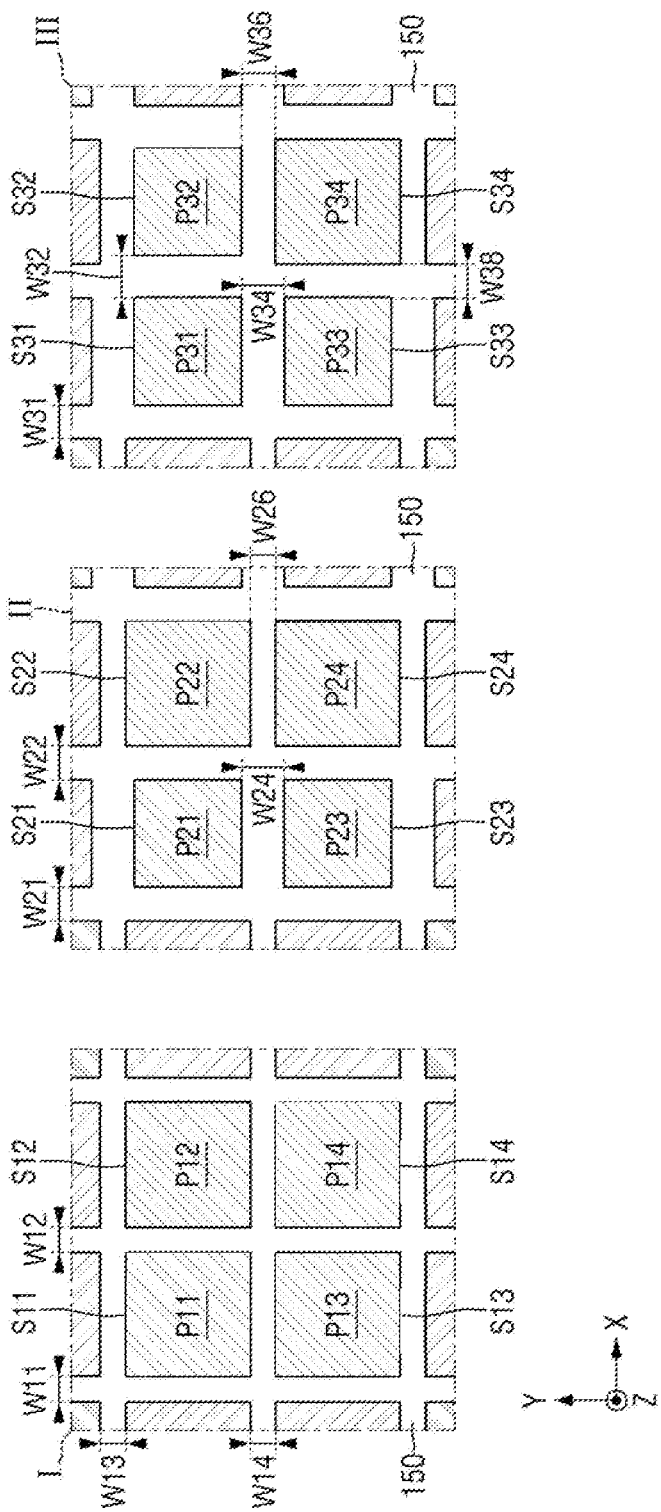

FIGS. 7 and 8 are various example partial layout diagrams illustrating first to third regions of FIG. 3. For simplicity of description, redundant parts of the description made with reference to FIGS. 1 to 6 may be recapitulated or omitted.

Referring to FIGS. 3, 7 and 8, in the image sensor according to some embodiments, the third region III spaced apart diagonally from the first region I may include a third merged pixel P31 to P34 that shares one of the plurality of color filters 170.

For example, the third region III may include the third merged pixel P31 to P34 sharing the first color filter RP. However, this is merely an example, and the third merged pixel P31 to P34 may share the second color filter GP or the third color filter BP. The grid pattern 150 may define light receiving areas S31 to S34 of the third merged pixel P31 to P34.

In some embodiments, the light receiving areas of at least some of the unit pixels UP may decrease as the unit pixels are farther away from the center CP of the light receiving region APS. For example, the light receiving areas S31, S32, and S33 of the pixels P31, P32, and P33 may be smaller than the light receiving areas S11, S12, and S13 of the pixels P11, P12, and P13.

In FIG. 7, as an example, widths W31 and W33 of the grid pattern 150 defining the light receiving areas S31, S32, and S33 of the pixels P31, P32, and P33 may be greater than the widths W11 and W13 of the grid pattern 150 defining the light receiving areas S11, S12, and S13 of the pixels P11, P12, and P13. A width W34 of the grid pattern 150 defining the light receiving areas S33 and S34 on the top surfaces of the pixels P33 and P34 may be the same as the width W14 of the grid pattern 150 defining the light receiving areas S13 and S14 on the top surfaces of the pixels P13 and P14.

In some embodiments, the light receiving areas of at least some of the unit pixels UP included in the third merged pixel P31 to P34 may decrease as the unit pixels are closer to the center CP of the light receiving region APS. For example, the light receiving area S31 of the pixel P31 may be smaller than the light receiving areas S32 and S33 of the pixels P32 and P33.

In FIG. 7, as an example, the width W31 of the grid pattern 150 defining the light receiving areas S31 and S33 on the left surfaces of the pixels P31 and P33 may be greater than a width W32 of the grid pattern 150 defining the light receiving areas S32 and S34 on the left surfaces of the pixels P32 and P34. The width W33 of the grid pattern 150 defining the light receiving areas S31 and S32 on the top surfaces of the pixels P31 and P32 may be greater than the width W34 of the grid pattern 150 defining the light receiving areas S33 and S34 on the top surfaces of the pixels P33 and P34.

In FIG. 8, as another example, the width W22 of the grid pattern 150 between the pixels P21 and P23 and the pixels P22 and P24 may be greater than the width W12 of the grid pattern 150 between the pixels P11 and P13 and the pixels P12 and P14. The width W24 of the grid pattern 150 between the pixel P21 and the pixel P23 may be greater than a width W26 of the grid pattern 150 between the pixel P22 and the pixel P24.

In FIG. 8, as another example, the width W32 of the grid pattern 150 between the pixel P31 and the pixel P32 may be greater than the width W12 of the grid pattern 150 between the pixel P11 and the pixel P12. The width W32 of the grid pattern 150 between the pixel P31 and the pixel P32 may be greater than a width W38 of the grid pattern 150 between the pixel P33 and the pixel P34. The width W34 of the grid pattern 150 between the pixel P31 and the pixel P33 may be greater than a width W36 of the grid pattern 150 between the pixel P32 and the pixel P34.

Figure 9:
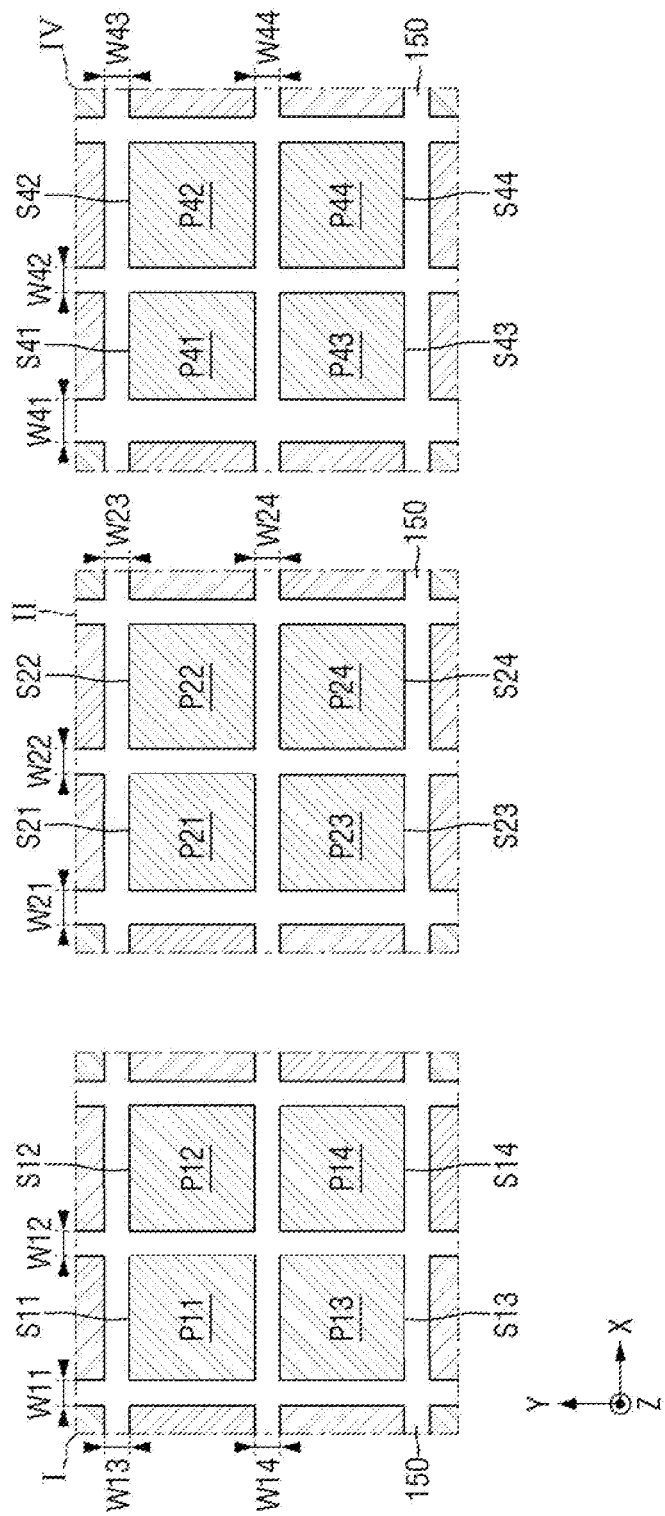
FIG. 9 is an example partial layout diagram illustrating a first region, a second region, and a fourth region of FIG. 3.

FIG. 9 is an example partial layout diagram illustrating a first region, a second region, and a fourth region of FIG. 3. For simplicity of description, redundant parts of the description made with reference to FIGS. 1 to 6 may be recapitulated or omitted.

Referring to FIGS. 3 and 9, in the image sensor according to some embodiments, the fourth region IV spaced apart from the second region II in the first direction X includes a fourth merged pixel P41 to P44 that shares one of the plurality of color filters 170.

As an example, the fourth region IV may include the fourth merged pixel P41 to P44 that shares the first color filter RP. However, this is merely example, and the fourth merged pixel P41 to P44 may share the second color filter GP or the third color filter BP. The grid pattern 150 may define light receiving areas S41 to S44 of the fourth merged pixel P41 to P44.

In some embodiments, the light receiving areas of at least some of the unit pixels UP may decrease as the unit pixels are farther away from the center CP of the light receiving region APS. For example, the light receiving areas S41 and S43 of the pixels P41 and P43 may be smaller than the light receiving areas S21 and S23 of the pixels P21 and P23. As an example, a width W41 of the grid pattern 150 defining the light receiving areas S41 and S43 on the left surfaces of the pixels P41 and P43 may be greater than the width W21 of the grid pattern 150 defining the light receiving areas S21 and S23 on the left surfaces of the pixels P21 and P23. A width W43 of the grid pattern 150 defining the light receiving areas S41 and S42 on the top surfaces of the pixels P41 and P42 may be the same as the width W23 of the grid pattern 150 defining the light receiving areas S21 and S22 on the top surfaces of the pixels P21 and P22. A width W44 of the grid pattern 150 defining the light receiving areas S43 and S44 on the top surfaces of the pixels P43 and P44 may be the same as the width W24 of the grid pattern 150 defining the light receiving areas S23 and S24 on the top surfaces of the pixels P23 and P24.

Figure 10:
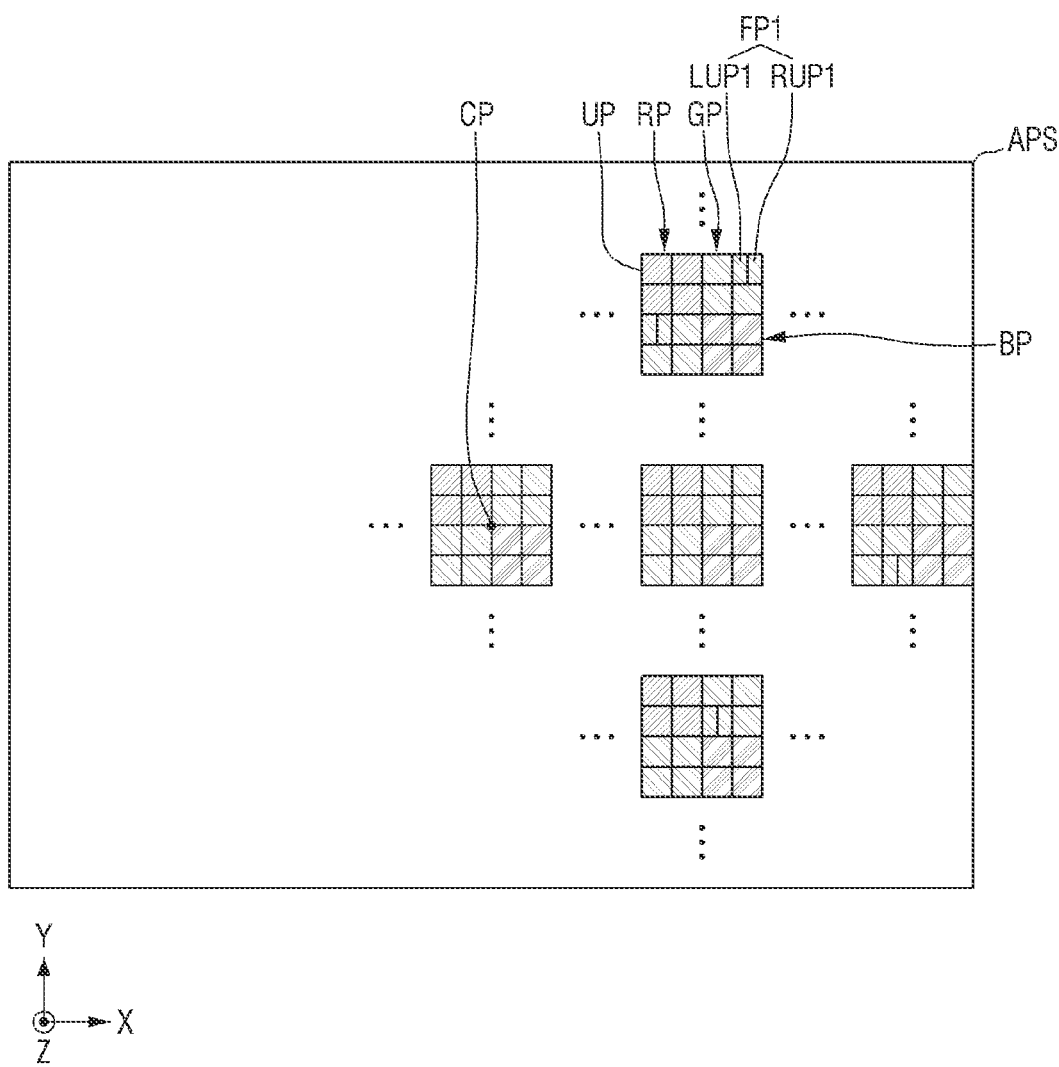
FIGS. 10 and 11 are various schematic layout diagrams of a light receiving region in an image sensor according to some embodiments.
Figure 11:
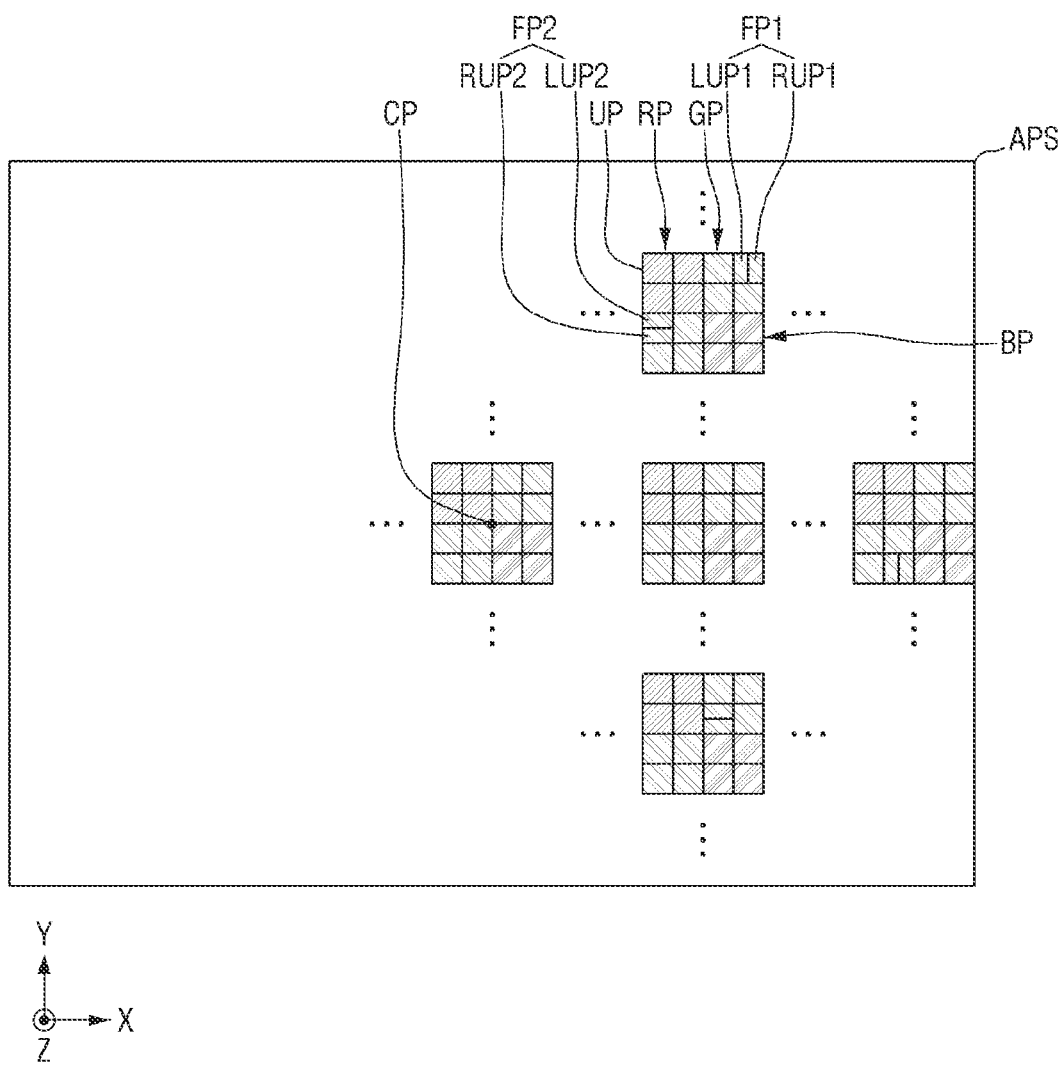

FIGS. 10 and 11 are various schematic layout diagrams of a light receiving region in an image sensor according to some embodiments. For simplicity of description, redundant parts of the description made with reference to FIGS. 1 to 6 may be recapitulated or omitted.

Referring to FIG. 10, in the image sensor according to some embodiments, at least some of the unit pixels UP include a first focus pixel FP1.

The first focus pixel FP1 may include a first sub-pixel LUP1 and a second sub-pixel RUP1. The first sub-pixel LUP1 and the second sub-pixel RUP1 may be arranged along, for example, the first direction X.

Referring to FIG. 11, in the image sensor according to some embodiments, at least some of the unit pixels UP further include a second focus pixel FP2.

The second focus pixel FP2 may include a third sub-pixel LUP2 and a fourth sub-pixel RUP2. The third sub-pixel LUP2 and the fourth sub-pixel RUP2 may be arranged along the second direction Y crossing the first direction X.

Each of the first focus pixel FP1 and the second focus pixel FP2 may perform an auto focus (AF) function. For example, since the first focus pixel FP1 and the second focus pixel FP2 may each include two sub-pixels (the first sub-pixel LUP1 and the second sub-pixel RUP1, or the third sub-pixel LUP2 and the fourth sub-pixel RUP2), it is possible to perform the auto focus function using a phase detection AF (PDAF).

Figure 12:
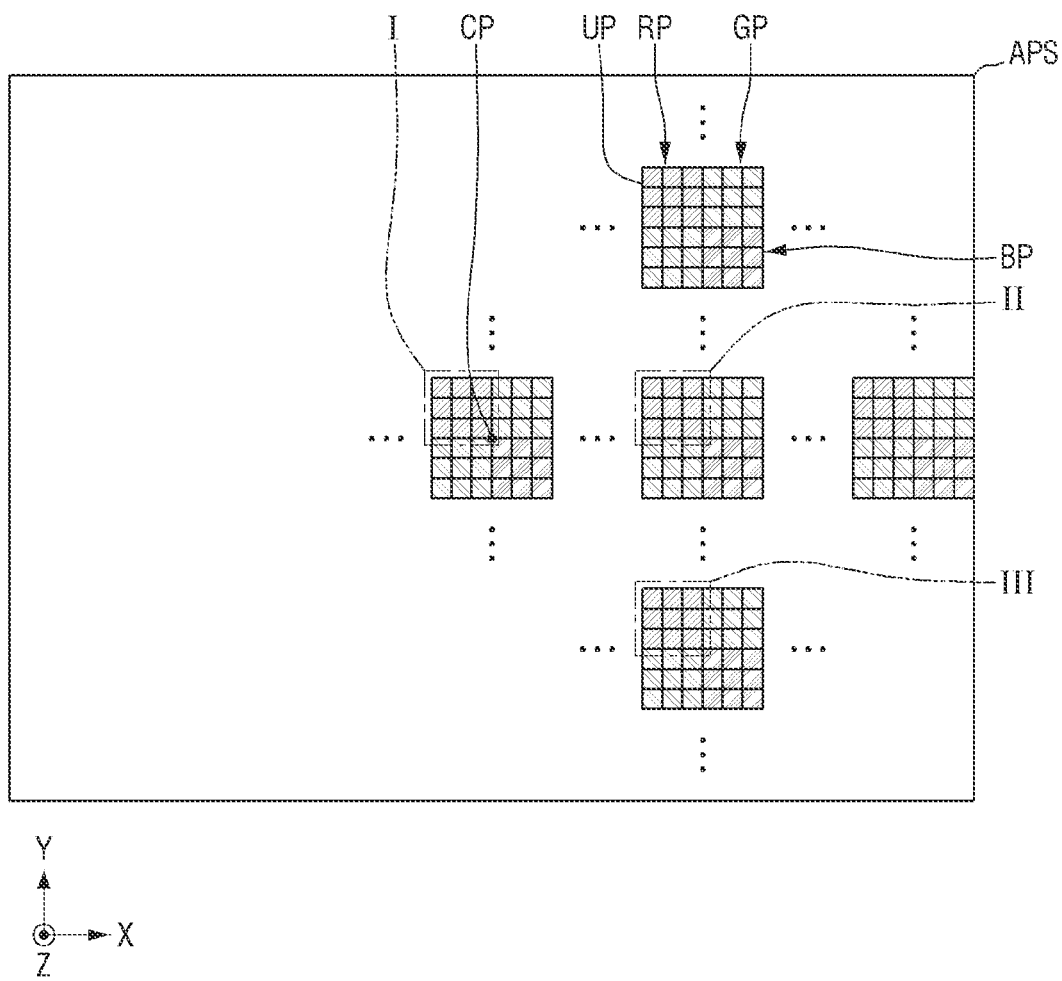
FIG. 12 is a schematic layout diagram of a light receiving region in an image sensor according to some embodiments.
Figure 13:
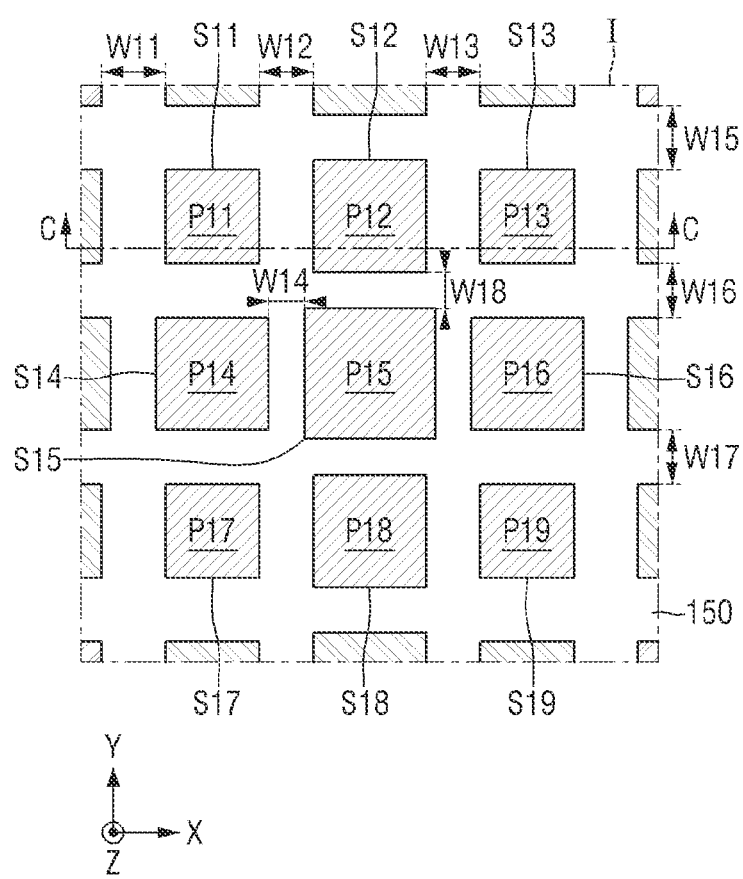
FIG. 13 is an example partial layout diagram illustrating a first region of FIG. 12.
Figure 14:
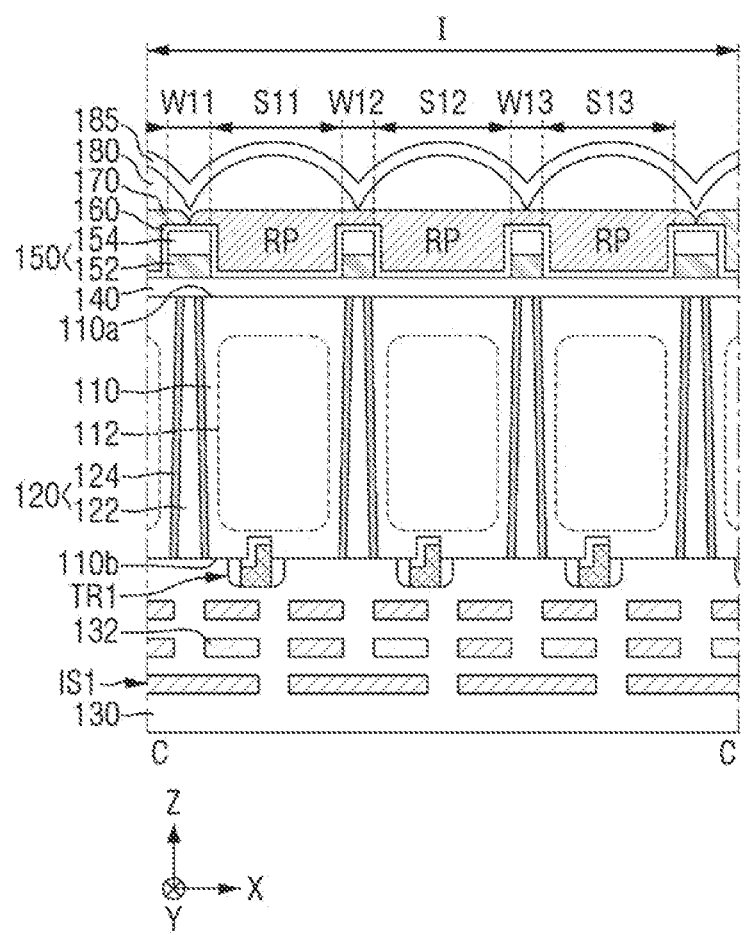
FIG. 14 is a cross-sectional view taken along line C-C of FIG. 13.
Figure 15:
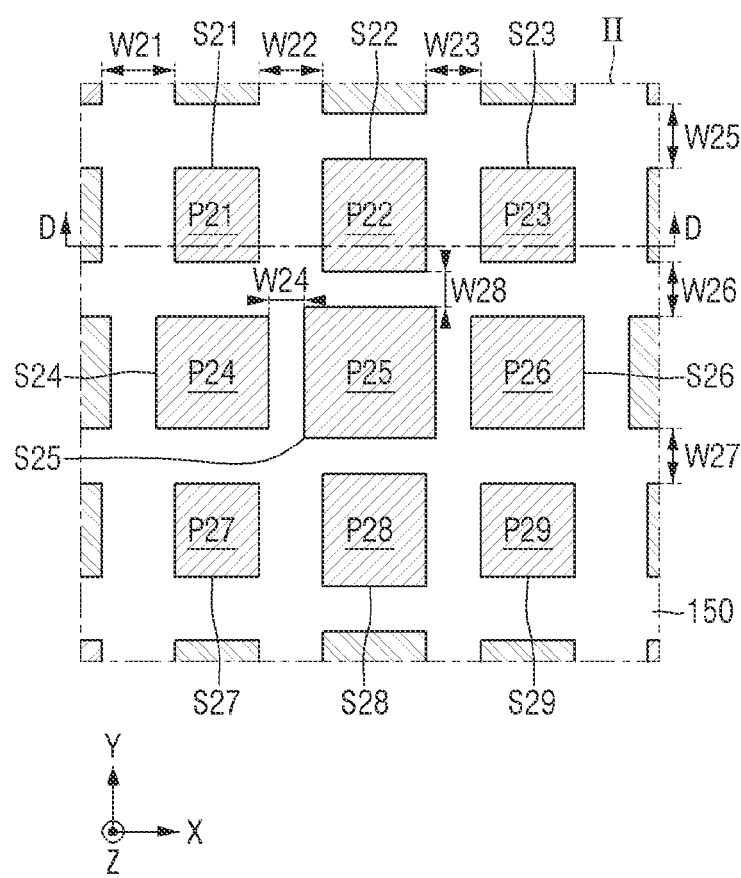
FIG. 15 is an example partial layout diagram illustrating a second region of FIG. 12.
Figure 16:
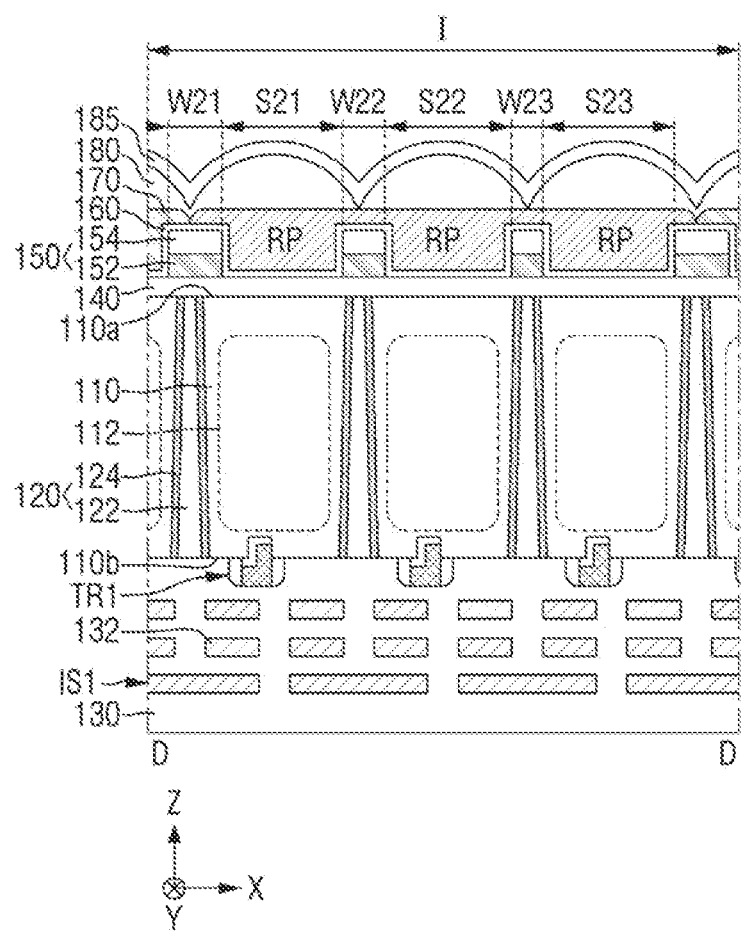
FIG. 16 is a cross-sectional view taken along line D-D of FIG. 15.

FIG. 12 is a schematic layout diagram of a light receiving region in an image sensor according to some embodiments. FIG. 13 is an example partial layout diagram illustrating a first region of FIG. 12. FIG. 14 is a cross-sectional view taken along line C-C of FIG. 13. FIG. 15 is an example partial layout diagram illustrating a second region of FIG. 12. FIG. 16 is a cross-sectional view taken along line D-D of FIG. 15. For simplicity of description, redundant parts of the description made with reference to FIGS. 1 to 6 may be recapitulated or omitted.

Referring to FIG. 12, in the image sensor according to some embodiments, nine unit pixels UP arranged in a 3×3 array may share one of the first color filter RP, the second color filter GP, and the third color filter BP.

Referring to FIGS. 12 to 14, in the image sensor according to some embodiments, the first region I includes a first merged pixel P11 to P19 that shares one of the plurality of color filters 170.

For example, the first region I may include the first merged pixel P11 to P19 that shares the first color filter RP. The grid pattern 150 may define light receiving areas S11 to S19 of the first merged pixel P11 to P19.

In some embodiments, the light receiving areas of at least some of the unit pixels UP included in the first merged pixel P11 to P19 may decrease as the unit pixels are closer to the edge of the first color filter RP. For example, the first merged pixel P11 to P19 may include a first central pixel P15 and a plurality of first peripheral pixels P11 to P14 and P16 to P19. The first peripheral pixels P11 to P14 and P16 to P19 may surround the first central pixel P15 in plan view as shown, e.g., in FIG. 13. In this case, each of the light receiving areas S11 to S14 and S16 to S19 of the first peripheral pixels P11 to P14 and P16 to P19 may be smaller than the light receiving area S15 of the first central pixel P15.

In some embodiments, the light receiving areas of at least some of the unit pixels UP included in the first peripheral pixels P11 to P14 and P16 to P19 may decrease as the unit pixels are closer to the vertex of the first color filter RP. For example, the pixels P11, P13, P17, and P19 may be disposed adjacent to the vertex of the first color filter RP, and the pixels P12, P14, P16, and P18 may be disposed away from the vertex of the first color filter RP. In this case, each of the light receiving areas S11, S13, S17, and S19 of the pixels P11, P13, P17, and P19 may be smaller than each of the light receiving areas S12, S14, S16, and S18 of the pixels P12, P14, P16, and P18.

As an example, a width W11 of the grid pattern 150 defining the light receiving area S11 on the left surface of the pixel P11 may be greater than widths W12 and W13 of the grid pattern 150 defining the light receiving area S12 on the left and right surfaces of the pixel P12. The width W12 of the grid pattern 150 between the pixel P11 and the pixel P12 may be greater than a width W14 of the grid pattern 150 between the pixel P14 and the pixel P15.

As an example, a width W15 of the grid pattern 150 defining the light receiving area S13 on the top surface of the pixel P13 may be greater than widths W16 and W17 of the grid pattern150 defining the light receiving area S16 on the top and bottom surfaces of the pixel P16. The width W16 of the grid pattern 150 between the pixel P13 and the pixel P16 may be greater than a width W18 of the grid pattern 150 between the pixel P12 and the pixel P15.

Referring to FIGS. 12, 15, and 16, in the image sensor according to some embodiments, the second region II includes a second merged pixel P21 to P29 that shares one of the plurality of color filters 170.

As an example, the second region II may include the second merged pixel P21 to P29 sharing the first color filter RP. The grid pattern 150 may define light receiving areas S21 to S29 of the second merged pixel P21 to P29.

In some embodiments, the light receiving areas of at least some of the unit pixels UP included in the second merged pixel P21 to P29 may decrease as the unit pixels are closer to the edge of the first color filter RP. For example, the second merged pixel P21 to P29 may include a second central pixel P25 and a plurality of second peripheral pixels P21 to P24 and P26 to P29. The second peripheral pixels P21 to P24 and P26 to P29 may surround the second central pixel P25 in plan view. In this case, each of the light receiving areas S21 to S24 and S26 to S29 of the second peripheral pixels P21 to P24 and P26 to P29 may be smaller than the light receiving area S25 of the second central pixel P25.

In some embodiments, the light receiving areas of at least some of the unit pixels UP may decrease as the unit pixels are farther away from the center CP of the light receiving region APS. For example, the light receiving areas S21 and S27 of the pixels P21 and P27 may be smaller than the light receiving areas S11 and S17 of the pixels P11 and P17. For example, a width W21 of the grid pattern 150 defining the light receiving area S21 on the left surface of the pixel P21 may be greater than the width W11 of the grid pattern 150 defining the light receiving area S11 on the left surface of the pixel P11. For example, the light receiving areas S22 and S28 of the pixels P22 and P28 may be smaller than the light receiving areas S12 and S18 of the pixels P12 and P18. As an example, a width W22 of the grid pattern 150 defining the light receiving area S22 on the left surface of the pixel P22 may be greater than the width W12 of the grid pattern 150 defining the light receiving area S12 on the left surface of the pixel P12.

In some embodiments, the width W22 of the grid pattern 150 defining the light receiving area S22 on the left surface of the pixel P22 may be smaller than the width W21 of the grid pattern 150 defining the light receiving area S21 on the left surface of the pixel P21, and may be greater than a width W23 of the grid pattern 150 defining the light receiving area S23 on the left surface of the pixel P23.

Figure 17:
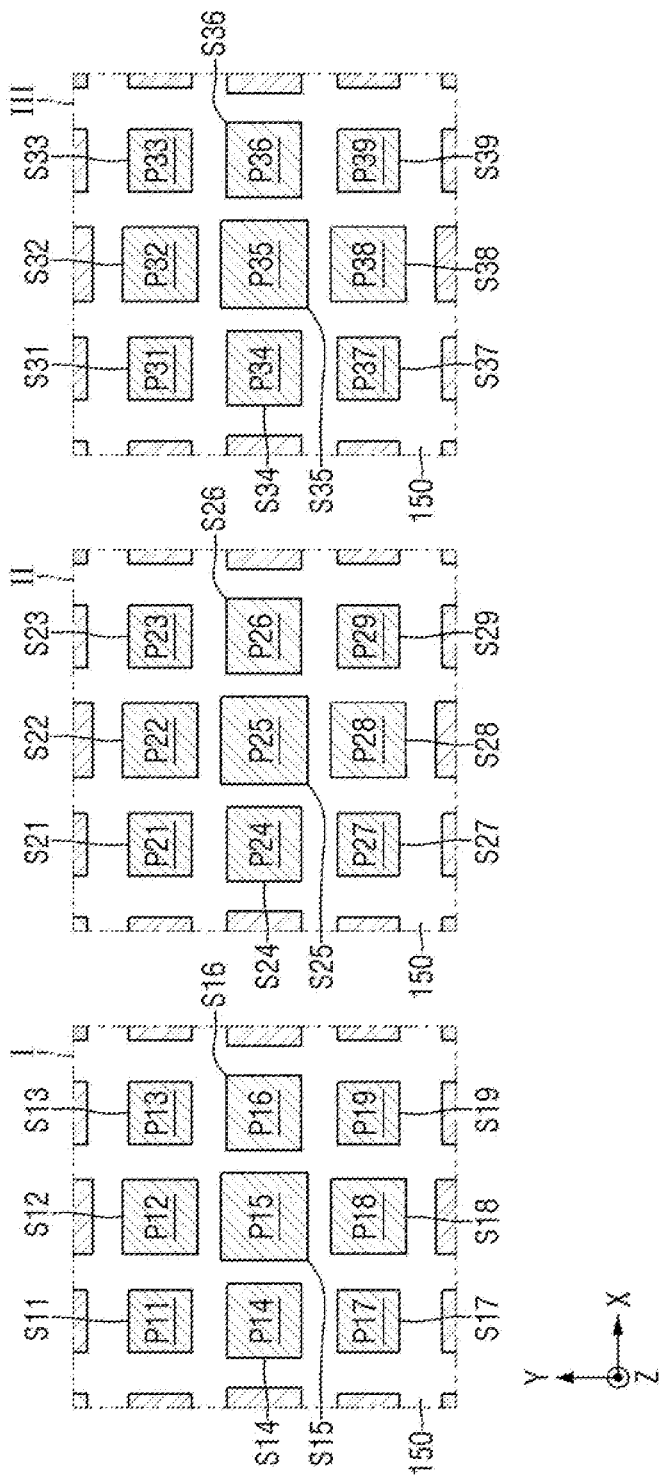
FIGS. 17 to 19 are various example partial layout diagrams illustrating the first to third regions of FIG. 12.
Figure 18:
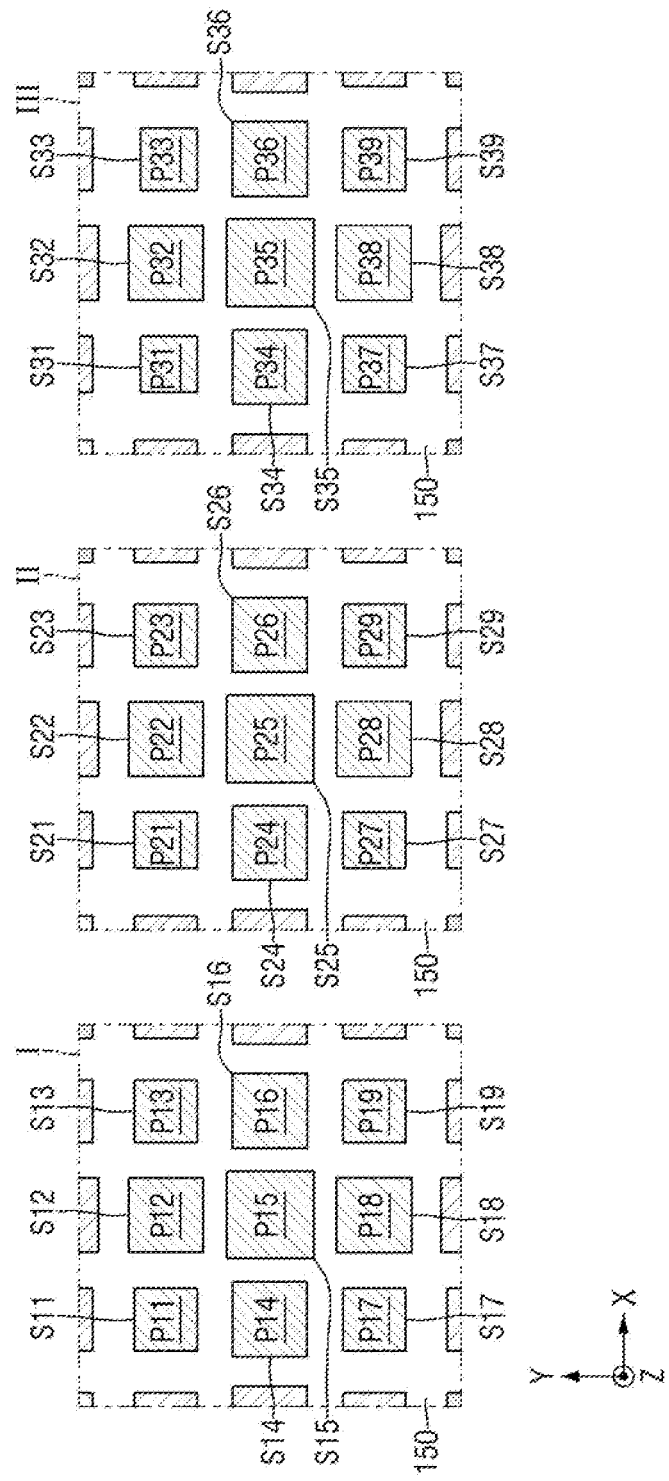
Figure 19:
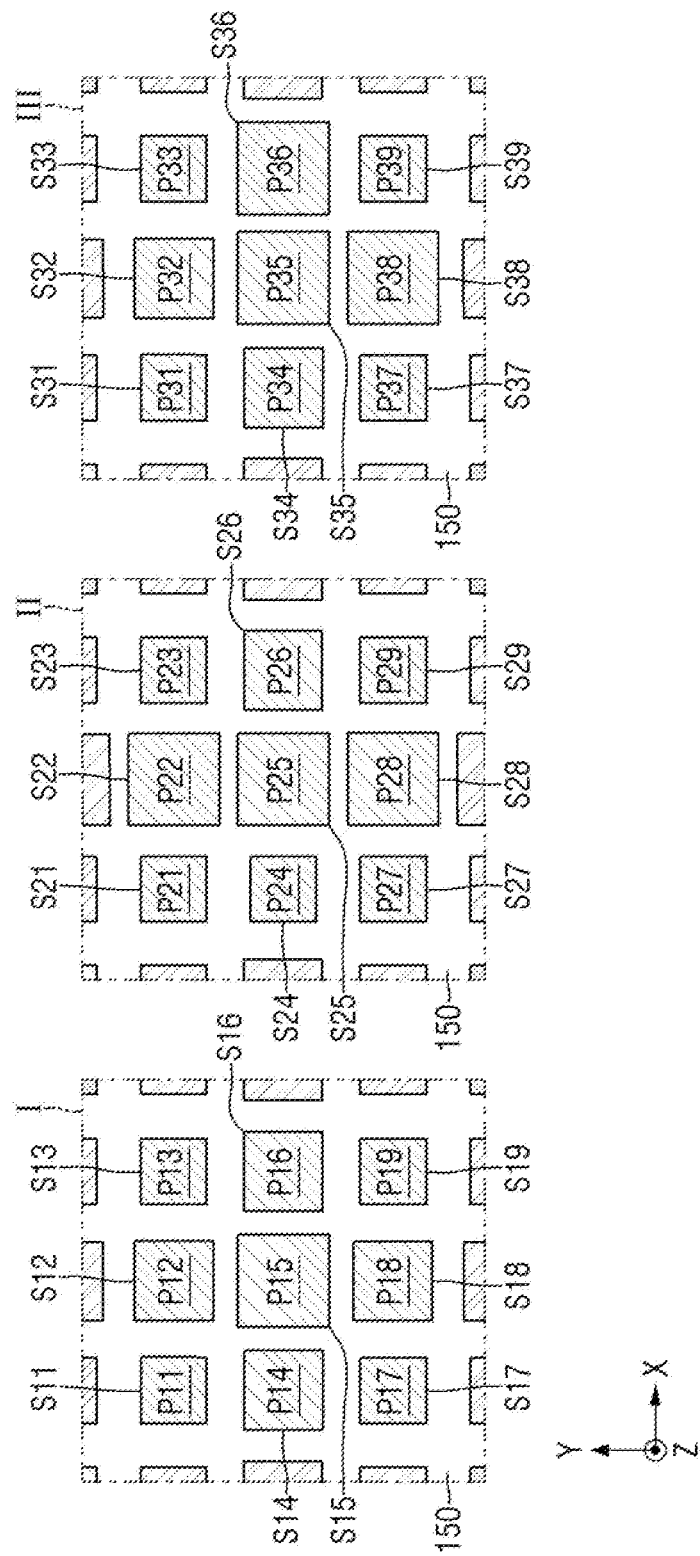

FIGS. 17 to 19 are various example partial layout diagrams illustrating the first to third regions of FIG. 12. For simplicity of description, redundant parts of the description made with reference to FIGS. 1 to 16 may be recapitulated or omitted.

Referring to FIGS. 12 and 17 to 19, in the image sensor according to some embodiments, the third region III spaced apart diagonally from the first region I includes a third merged pixel P31 to P39 that shares one of the plurality of color filters 170.

As an example, the third region III may include the third merged pixel P31 to P39 that shares the first color filter RP. The grid pattern 150 may define light receiving areas S31 to S39 of the third merged pixel P31 to P39.

Referring to FIGS. 12 and 17, in the image sensor according to some embodiments, the first merged pixel P11 to P19, the second merged pixel P21 to P29, and the third merged pixel P31 to P39 may be arranged in the same shape.

For example, the light receiving areas S31, S33, S37, and S39 of the pixels P31, P33, P37, and P39 may be the same as the light receiving areas S11 and S21 of the pixels P11 and P21. The light receiving areas S32, S34, S36, and S38 of the pixels P32, P34, P36, and P38 may be the same as the light receiving areas S12 and S22 of the pixels P12 and P22. The light receiving area S35 of the pixel P35 may be the same as the light receiving areas S15 and S25 of the pixels P15 and P25.

Referring to FIGS. 12 and 18, in the image sensor according to some embodiments, the light receiving areas of at least some of the unit pixels UP may decrease as the unit pixels are farther away from the center CP of the light receiving region APS.

For example, since both the second region II and the third region III may be spaced apart from the first region I in the first direction X, the light receiving areas S21, S27, S31, and S37 of the pixels P21, P27, P31 and P37 may be smaller than the light receiving areas S11 and S17 of the pixels P11 and P17. In addition, since the second region II may be spaced apart from the third region III in the second direction Y, the light receiving areas S31 and S33 of the pixels 31 and 33 may be smaller than the light receiving areas S21 and S23 of the pixels P21 and P23.

Referring to FIGS. 12 and 19, in the image sensor according to some embodiments, the light receiving areas of at least some of the peripheral pixels may increase as the peripheral pixels are farther away from the center CP of the light receiving region APS.

For example, the light receiving areas S22 and S28 of the pixels P22 and P28 may be greater than the light receiving areas S12 and S18 of the pixels P12 and P18. Further, the light receiving areas S36 and S38 of the pixels P36 and P38 may be greater than the light receiving areas S16 and S18 of the pixels P16 and P18.

Figure 20:
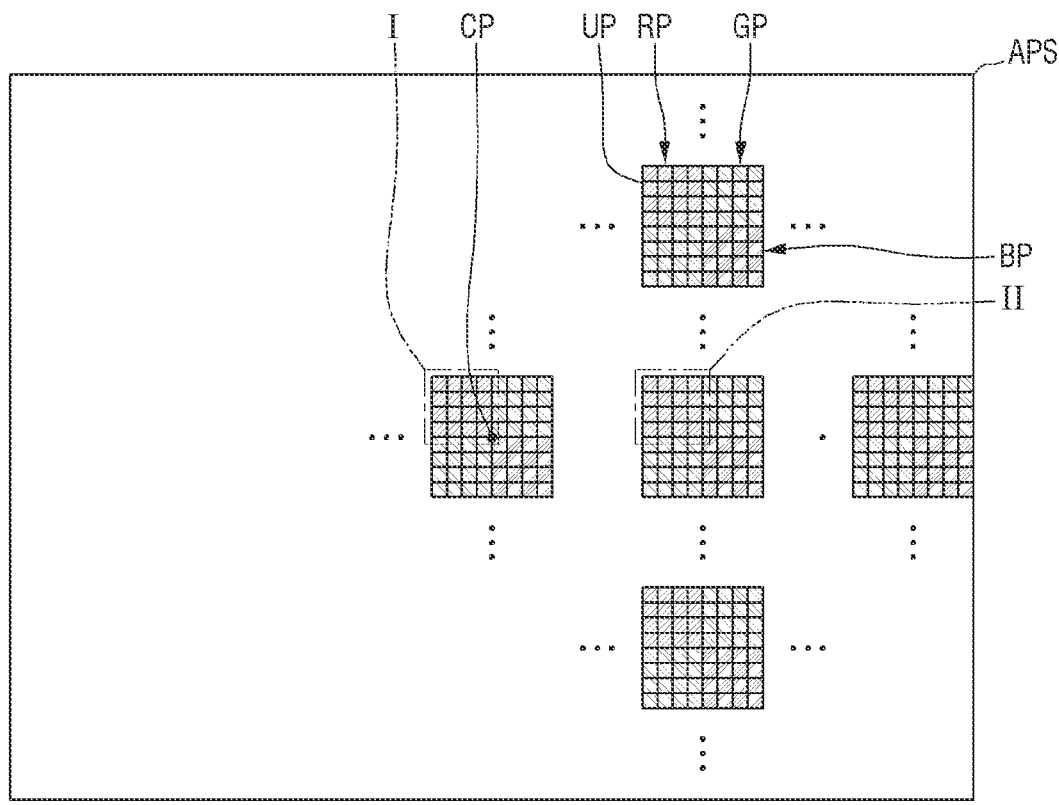
FIG. 20 is a schematic layout diagram of a light receiving region in an image sensor according to some embodiments.
Figure 21:
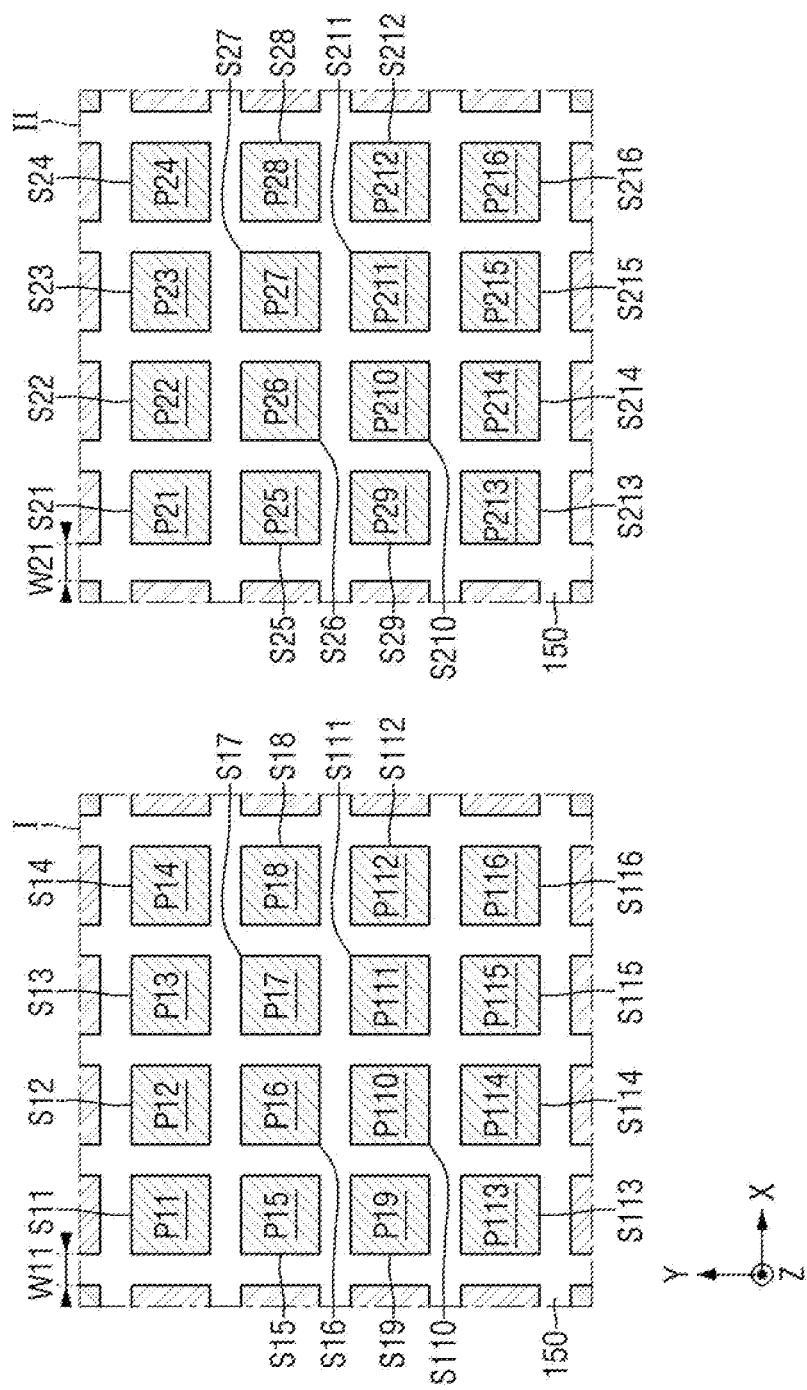
FIG. 21 is an example partial layout diagram illustrating a first region and a second region of FIG. 20.

FIG. 20 is a schematic layout diagram of a light receiving region in an image sensor according to some embodiments. FIG. 21 is an example partial layout diagram illustrating a first region and a second region of FIG. 20. For simplicity of description, redundant parts of the description made with reference to FIGS. 1 to 19 may be recapitulated or omitted.

Referring to FIG. 20, in the image sensor according to some embodiments, sixteen unit pixels UP arranged in 4×4 array may share one of the first color filter RP, the second color filter GP, and the third color filter BP.

Referring to FIGS. 20 and 21, in the image sensor according to some embodiments, the first region I includes a first merged pixel P11 to P116 that shares one of the plurality of color filters 170, and the second region II includes a second merged pixel P21 to P216 that shares one of the plurality of color filters 170.

As an example, the first region I may include the first merged pixel P11 to P116 sharing the first color filter RP, and the second region II may include the second merged pixel P21 to P216 sharing the first color filter RP. The grid pattern 150 may define light receiving areas S11 to S116 of the first merged pixel P11 to P116 and light receiving areas S21 to S216 of the second merged pixel P21 to P216.

In some embodiments, the light receiving areas of at least some of the unit pixels UP may decrease as the unit pixels are farther away from the center CP of the light receiving region APS. In some embodiments, the light receiving areas of at least some of the unit pixels UP included in the second merged pixel P21 to P216 may decrease as the unit pixels are closer to the center CP of the light receiving region APS. For example, the light receiving areas S21, S25, S29, and S213 of the pixels P21, P25, P29, and P213 may be smaller than the light receiving areas S11, S15, S19, and S113 of the pixels P11, P15, P19, and P113. As an example, a width W21 of the grid pattern 150 defining the light receiving areas S21, S25, S29, and S213 on the left surfaces of the pixels P21, P25, P29, and P213 may be greater than a width W11 of the grid pattern 150 defining the light receiving areas S11, S15, S19, S113 on the left surfaces of the pixels P11, P15, P19, and P113.

Figure 22:
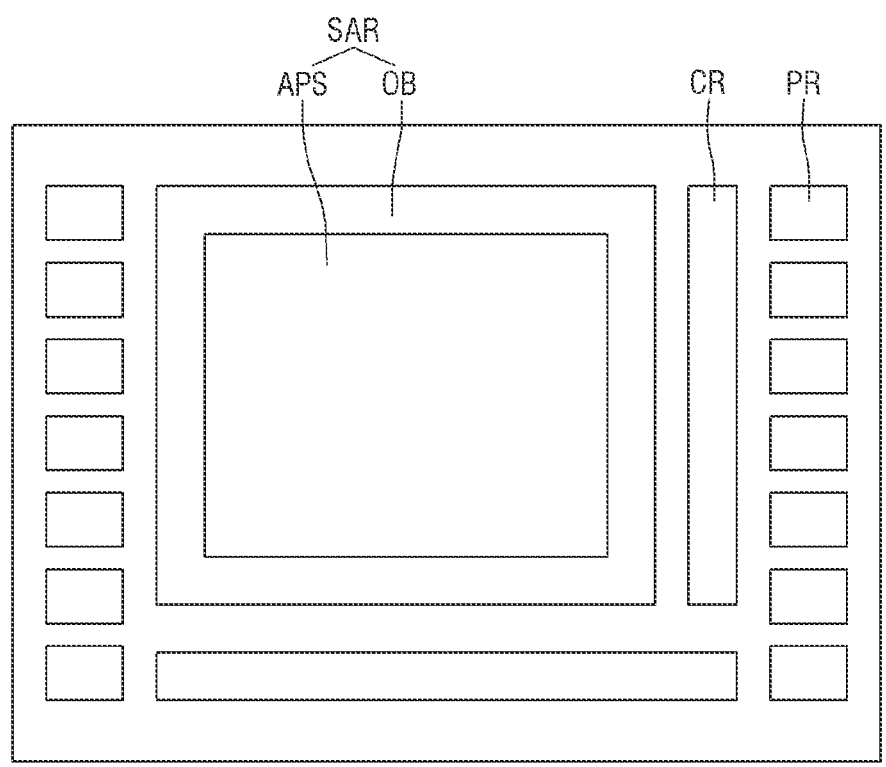
FIG. 22 is a schematic layout diagram explaining an image sensor according to some embodiments.
Figure 23:
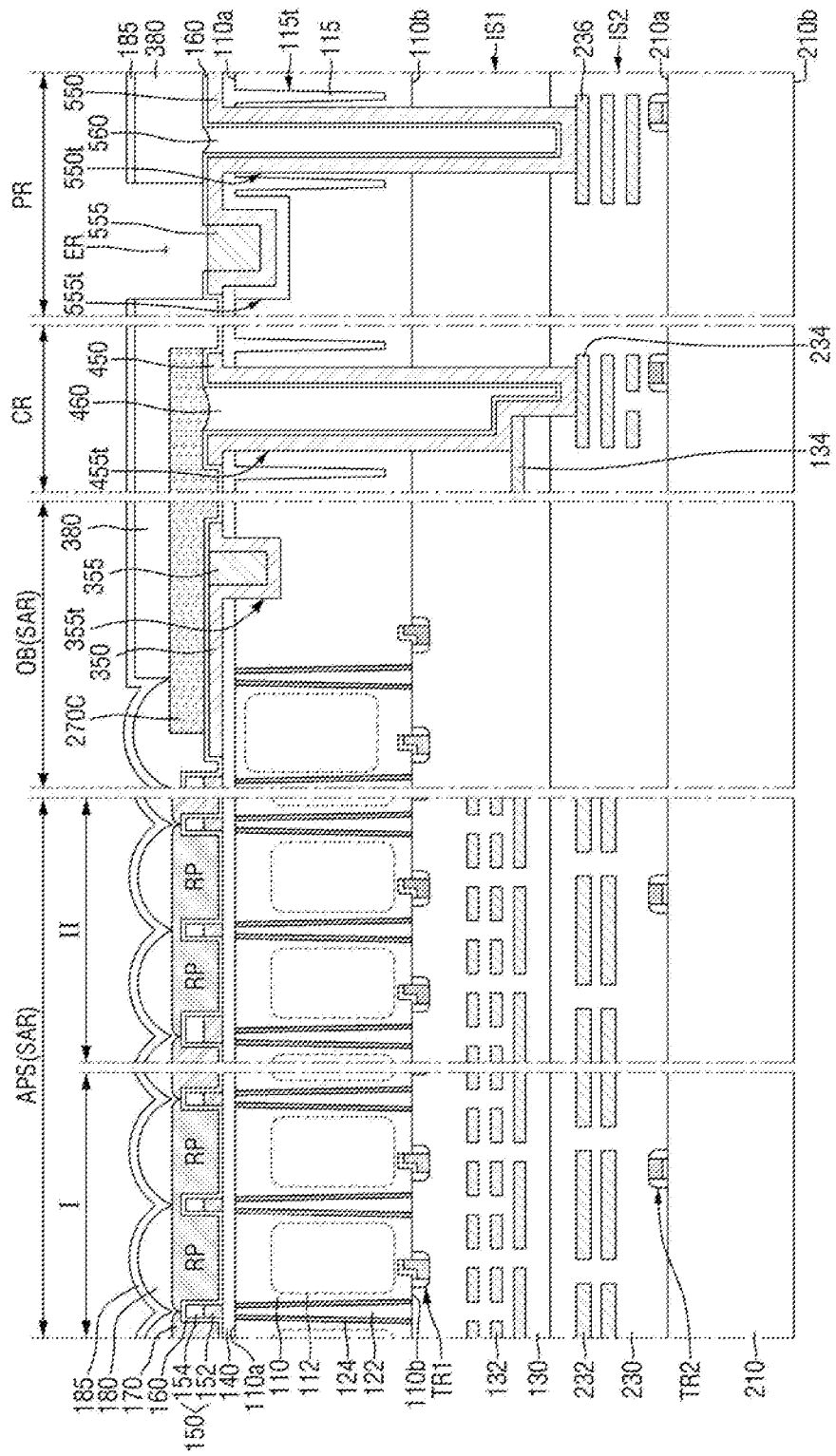
FIG. 23 is a schematic cross-sectional view illustrating an image sensor according to some embodiments.

FIG. 22 is a schematic layout diagram explaining an image sensor according to some embodiments. FIG. 23 is a schematic cross-sectional view illustrating an image sensor according to some embodiments. For simplicity of description, redundant parts of the description made with reference to FIGS. 1 to 6 may be recapitulated or omitted.

Referring to FIGS. 22 and 23, the image sensor according to some embodiments may include a sensor array region SAR, a connection region CR, and a pad region PR.

The sensor array region SAR may include an area corresponding to the APS 10 shown in FIG. 1. For example, in the sensor array region SAR, a plurality of unit pixels (e.g., UP in FIG. 3) may be arranged two-dimensionally (e.g., in a matrix form).

The sensor array region SAR may include a light receiving region APS and a light blocking region OB. Active pixels that receive light to generate active signals may be arranged in the light receiving region APS. Optical black pixels that generate optical black signals by blocking light may be arranged in the light blocking region OB. The light blocking region OB may be formed, for example, along the periphery of the light receiving region APS, but this is merely an example.

In some embodiments, the photoelectric conversion layer 112 may not be formed in a part of the light blocking region OB. For example, the photoelectric conversion layer 112 may be formed in the first substrate 110 in the light blocking region OB adjacent to the light receiving region APS, but may not be formed in the first substrate 110 in the light blocking region OB spaced apart or farther way from the light receiving region APS. In some embodiments, dummy pixels may be formed in the light receiving region APS adjacent to the light blocking region OB.

The connection region CR may be formed around the sensor array region SAR. The connection region CR may be formed on one side of the sensor array region SAR, but this is merely example. Wires are formed in the connection region CR, and may be configured to transmit and receive electrical signals of the sensor array region SAR.

The pad region PR may be formed around the sensor array region SAR. The pad region PR may be formed adjacent to the edge of the image sensor according to some embodiments, but this is merely an example. The pad region PR may be connected to an external device or the like to allow the image sensor according to some embodiments to transmit and receive electrical signals to and from the external device.

The connection region CR is shown to be interposed between the sensor array region SAR and the pad region PR, but this is merely an example. The arrangement of the sensor array region SAR, the connection region CR, and the pad region PR may vary depending on the requirement.

In some embodiments, the first wiring structure IS1 may include the first wire 132 in the sensor array region SAR and a second wire 134 in the connection region CR. The first wire 132 may be electrically connected to the unit pixels (e.g., UP of FIG. 3) of the sensor array region SAR. For example, the first wire 132 may be connected to the first electronic element TR1. At least a part of the second wire 134 may be electrically connected to at least a part of the first wire 132. For example, at least a part of the second wire 134 may extend from the sensor array region SAR. Accordingly, the second wire 134 may be electrically connected to the unit pixels (e.g., UP of FIG. 3) of the sensor array region SAR.

The image sensor according to some embodiments may further include a second substrate 210, a second wiring structure IS2, a first connection structure 350, a second connection structure 450, a third connection structure 550, an element isolation pattern 115, a light blocking filter 270C, and a third passivation layer 380.

The second substrate 210 may be a bulk silicon or silicon-on-insulator (SOI) substrate. The second substrate 210 may be a silicon substrate, or may include other materials such as silicon germanium, indium antimonide, lead tellurium compound, indium arsenide, indium phosphide, gallium arsenide, or gallium antimonide. Alternatively, the second substrate 210 may have an epitaxial layer formed on a base substrate.

The second substrate 210 may include a third surface 210a and a fourth surface 210b opposite to each other. In some embodiments, the third surface 210a of the second substrate 210 may face the second surface 110b of the first substrate 110.

In some embodiments, a second electronic element TR2 may be formed on the third surface 210a of the second substrate 210. The second electronic element TR2 may be electrically connected to the sensor array region SAR, and may transmit and receive an electrical signal to and from each of the unit pixels (e.g., UP of FIG. 3) of the sensor array region SAR. For example, the second electronic element TR2 may include electronic elements constituting the row decoder 20, the row driver 30, the column decoder 40, the timing generator 50, the CDS 60, the ADC 70, or the input/output buffer 80 shown in FIG. 1.

The second wiring structure IS2 may be formed on the third surface 210a of the second substrate 210. The second wiring structure IS2 may be attached to the first wiring structure IS1. For example, as shown in FIG. 23, the top surface of the second wiring structure IS2 may be attached to the bottom surface of the first wiring structure IS1.

The second wiring structure IS2 may include one or a plurality of wires. For example, the second wiring structure IS2 may include a second inter-wire insulating layer 230 and a plurality of wires 232, 234, and 236 in the second inter-wire insulating layer 230. In FIG. 23, the number of layers and arrangements of wires constituting the second wiring structure IS2 are merely examples, and are not limited thereto.

At least some of the wires 232, 234, and 236 of the second wiring structure IS2 may be connected to the second electronic element TR2. In some embodiments, the second wiring structure IS2 may include a third wire 232 in the sensor array region SAR, a fourth wire 234 in the connection region CR, and a fifth wire 236 in the pad region PR. In some embodiments, the fourth wire 234 may be an uppermost wire among a plurality of wires in the connection region CR, and the fifth wire 236 may be an uppermost wire among a plurality of wires in the pad region PR.

The first connection structure 350 may be formed in the light blocking region OB. The first connection structure 350 may be formed on the surface insulating layer 140 of the light blocking region OB. In some embodiments, the first connection structure 350 may be in contact with the pixel isolation pattern 120. For example, a first trench 355t exposing the pixel isolation pattern 120 may be formed in the first substrate 110 and the surface insulating layer 140 in the light blocking region OB. The first connection structure 350 may be formed in the first trench 355t to be in contact with the pixel isolation pattern 120 in the light blocking region OB. In some embodiments, the first connection structure 350 may extend along the profiles of the side and bottom surfaces of the first trench 355t.

In some embodiments, the first connection structure 350 may be electrically connected to the conductive filling pattern 122 to apply a ground voltage or a negative voltage to the conductive filling pattern 122. Accordingly, the electric charges generated by ESD or the like may be discharged to the first connection structure 350 through the conductive filling pattern 122, and the ESD bruise defect may be effectively prevented.

The second connection structure 450 may be formed in the connection region CR. The second connection structure 450 may be formed on the surface insulating layer 140 in the connection region CR. The second connection structure 450 may electrically connect the first substrate 110 to the second substrate 210. For example, a second trench 455t exposing the second wire 134 and the fourth wire 234 may be formed in the first substrate 110, the first wiring structure IS1, and the second wiring structure IS2 in the connection region CR. The second connection structure 450 may be formed in the second trench 455t to connect the second wire 134 to the fourth wire 234. In some embodiments, the second connection structure 450 may extend along the profiles of the side and bottom surfaces of the second trench 455t.

The third connection structure 550 may be formed in the pad region PR. The third connection structure 550 may be formed on the surface insulating layer 140 in the pad region PR. The third connection structure 550 may electrically connect the second substrate 210 to an external device or the like.

For example, a third trench 550t exposing the fifth wire 236 may be formed in the first substrate 110, the first wiring structure IS1, and the second wiring structure IS2 in the pad region PR. The third connection structure 550 may be formed in the third trench 550t to be in contact with the fifth wire 236. In addition, a fourth trench 555t may be formed in the first substrate 110 in the pad region PR. The third connection structure 550 may be formed in the fourth trench 555t and be exposed. In some embodiments, the third connection structure 550 may extend along the profiles of the side and bottom surfaces of the third trench 550t and the fourth trench 555t.

Each of the first connection structure 350, the second connection structure 450, and the third connection structure 550 may include, for example, at least one of titanium (Ti), titanium nitride (TiN), tantalum (Ta), tantalum nitride (TaN), tungsten (W), aluminum (Al), copper (Cu), or a combination thereof, but is not limited thereto. In some embodiments, the first connection structure 350, the second connection structure 450, and the third connection structure 550 may be formed at the same level. The term "the same level" as used herein means being formed by the same manufacturing process.

In some embodiments, a first pad 355 filling the first trench 355t may be formed on the first connection structure 350. In some embodiments, a second pad 555 filling the fourth trench 555t may be formed on the third connection structure 550. Each of the first pad 355 and the second pad 555 may include, for example, at least one of tungsten (W), copper (Cu), aluminum (Al), gold (Au), silver (Ag), or an alloy thereof, but is not limited thereto. In some embodiments, the first pad 355 and the second pad 555 may be formed at the same level.

In some embodiments, a first filling insulating layer 460 filling the second trench 455t may be formed on the second connection structure 450. In some embodiments, a second filling insulating layer 560 filling the third trench 550t may be formed on the third connection structure 550. Each of the first filling insulating layer 460 and the second filling insulating layer 560 may include, for example, at least one of silicon oxide, aluminum oxide, tantalum oxide, or a combination thereof, but is not limited thereto. In some embodiments, the first filling insulating layer 460 and the second filling insulating layer 560 may be formed at the same level.

In some embodiments, the first passivation layer 160 may cover the first connection structure 350, the first pad 355, the second connection structure 450, and the third connection structure 550. For example, the first passivation layer 160 may extend conformally along the profiles of the first connection structure 350, the first pad 355, the second connection structure 450, and the third connection structure 550 as shown, e.g., in FIG. 23. In some embodiments, the first passivation layer 160 may expose the second pad 555.

The element isolation pattern 115 may be formed in the first substrate 110. For example, an element isolation trench 115t may be formed in the first substrate 110. The element isolation pattern 115 may be formed in the element isolation trench 115t. In some embodiments, the element isolation pattern 115 may extend from the first surface 110a of the first substrate 110 into the first substrate 110. In some embodiments, the element isolation pattern 115 may be spaced apart from the second surface 110b of the first substrate 110.

In FIG. 23, it is shown that the element isolation pattern 115 is formed only around the second connection structure 450 in the connection region CR and around the third connection structure 550 in the pad region PR, but this is merely an example. For example, the element isolation pattern 115 may also be formed around the first connection structure 350 in the light blocking region OB.

The element isolation pattern 115 may include, for example, at least one of silicon oxide, silicon nitride, silicon oxynitride, aluminum oxide, hafnium oxide, or a combination thereof, but is not limited thereto. In some embodiments, the element isolation pattern 115 may be formed at the same level as the surface insulating layer 140.

The light blocking filter 270C may cover at least a part of the light blocking region OB. For example, the light blocking filter 270C may be formed on the first connection structure 350 and the second connection structure 450. The light blocking filter 270C may include, for example, a blue filter, but is not limited thereto.

The third passivation layer 380 may be formed on the light blocking filter 270C. For example, the third passivation layer 380 may be formed to cover a part of the first passivation layer 160 in the light blocking region OB, the connection region CR, and the pad region PR. In some embodiments, the second passivation layer 185 may extend along the surface of the third passivation layer 380. The third passivation layer 380 may include, for example, a light transmitting resin, but is not limited thereto. In some embodiments, the third passivation layer 380 may include the same material as that of the microlens 180.

In some embodiments, the second passivation layer 185 and the third passivation layer 380 may expose the second pad 555. For example, an exposure opening ER that exposes the second pad 555 may be formed in the second passivation layer 185 and the third passivation layer 380. Accordingly, the second pad 555 may be connected to the external device or the like to allow the image sensor according to some embodiments to transmit and receive electrical signals to and from the external device. That is, the second pad 555 may be an input/output pad of the image sensor according to some embodiments.

In concluding the detailed description, those skilled in the art will appreciate that many variations and modifications may be made to embodiments without substantially departing from the principles of the disclosure. Therefore, embodiments of the disclosure are used in a generic and descriptive sense only and not for purposes of limitation.

What is claimed is:

1. An image sensor comprising:
   a substrate comprising a first surface on which light is incident and a second surface opposite to the first surface;
   a plurality of unit pixels in the substrate, each of the plurality of unit pixels comprising a respective photoelectric conversion layer;
   a light receiving region in which the plurality of unit pixels are arranged;
   a plurality of color filters on the first surface of the substrate;
   a grid pattern on the first surface of the substrate, the grid pattern defining a respective light receiving area of each of the plurality of unit pixels; and
   a plurality of microlenses on the plurality of color filters, each of the plurality of microlenses corresponding to a respective one of the plurality of unit pixels,
   wherein the plurality of unit pixels comprises a first pixel and a second pixel sharing a first color filter of the plurality of color filters,
   wherein the grid pattern comprises a first portion between the first pixel and the second pixel over which the first color filter extends such that the first color filter is shared by the first pixel and the second pixel,
   wherein a first light receiving area of the first pixel that shares the first color filter with the second pixel is different from a second light receiving area of the second pixel that shares the first color filter with the first pixel,
   wherein the first pixel is closer than the second pixel to a center of the light receiving region, and
   wherein the first light receiving area is smaller than the second light receiving area.

2. The image sensor of claim 1, wherein a width of the first portion of the grid pattern defining the first light receiving area is different from a width of a second portion of the grid pattern defining the second light receiving area.

3. The image sensor of claim 1, wherein the first pixel is closer than the second pixel to an edge of the first color filter, and
   wherein the first light receiving area is smaller than the second light receiving area.

4. The image sensor of claim 1, wherein the plurality of unit pixels further comprises a third pixel and a fourth pixel sharing a second color filter of the plurality of color filters, and
   wherein a third light receiving area of the third pixel is different from a fourth light receiving area of the fourth pixel.

5. The image sensor of claim 4,
   wherein the first color filter is closer than the second color filter to the center of the light receiving region, and
   wherein the third light receiving area is smaller than the first light receiving area.

6. The image sensor of claim 4, wherein the first color filter and the second color filter have a same color.

7. The image sensor of claim 1, wherein the plurality of color filters are arranged in a Bayer pattern.

8. The image sensor of claim 1, further comprising, in the substrate, a pixel isolation pattern configured to isolate each of the photoelectric conversion layers from each other.

9. The image sensor of claim 1, further comprising:
   an electronic element on the second surface of the substrate; and
   a wiring structure electrically connected to the electronic element on the second surface of the substrate.

10. An image sensor comprising:
    a light receiving region in which a plurality of unit pixels are arranged;
    one first color filter on a substrate;
    one second color filter farther than the one first color filter from a center of the light receiving region;
    a first merged pixel including a first group of unit pixels sharing the one first color filter among the plurality of unit pixels;
    a second merged pixel including a second group of unit pixels sharing the one second color filter among the plurality of unit pixels; and
    a grid pattern defining a respective light receiving area of each of the first group of unit pixels across the one first color filter,
    wherein the first merged pixel comprises a first pixel and a second pixel farther than the first pixel from the center of the light receiving region,
    wherein the one first color filter is provided over both the first pixel and the second pixel,
    wherein a first light receiving area of the first pixel that shares the one first color filter with the second pixel is smaller than a second light receiving area of the second pixel that shares the one first color filter with the first pixel,
    wherein the second merged pixel comprises a third pixel, and
    wherein a third light receiving area of the third pixel is smaller than the first light receiving area of the first pixel.

11. The image sensor of claim 10, wherein a width of a first portion of the grid pattern defining the first light receiving area is greater than a width of a second portion of the grid pattern defining the second light receiving area.

12. The image sensor of claim 10,
    wherein the second merged pixel further comprises a fourth pixel farther than the third pixel from the center of the light receiving region, and
    wherein the third light receiving area of the third pixel is smaller than a fourth light receiving area of the fourth pixel.

13. The image sensor of claim 12, wherein the one first color filter and the one second color filter have a same color.

14. An image sensor comprising:
    a plurality of unit pixels in a substrate;
    a light receiving region on which light is incident;
    one first color filter on the substrate;
    a first merged pixel comprising a first group of unit pixels sharing the one first color filter among the plurality of unit pixels; and
    a grid pattern defining a respective light receiving area of each of the plurality of unit pixels across the one first color filter, wherein the first merged pixel comprises a first central pixel and a plurality of first peripheral pixels surrounding the first central pixel, wherein the one first color filter is provided over the first central pixel and the plurality of first peripheral pixels, wherein a light receiving area of each of the plurality of first peripheral pixels that share the one first color filter with the first central pixel is smaller than a light receiving area of the first central pixel that shares the one first color filter with each of the plurality of first peripheral pixels, wherein the plurality of first peripheral pixels comprises a first pixel and a second pixel closer than the first pixel to a center of the light receiving region, and wherein a light receiving area of the second pixel is smaller than a light receiving area of the first pixel.

15. The image sensor of claim 14, wherein the plurality of first peripheral pixels comprises a third pixel and a fourth pixel closer than the first third pixel to a vertex of the one first color filter, and wherein a light receiving area of the fourth pixel is smaller than a light receiving area of the third pixel.

16. The image sensor of claim 14, wherein a height of a top surface of the one first color filter decreases toward an edge of the one first color filter.

17. The image sensor of claim 14, further comprising:

one second color filter on the substrate, the one second color filter being farther than the one first color filter from the center of the light receiving region; and a second merged pixel comprising a second group of unit pixels sharing the one second color filter among the plurality of unit pixels, wherein the second merged pixel further comprises a second central pixel and a plurality of second peripheral pixels surrounding the second central pixel, and wherein a light receiving area of each of the plurality of second peripheral pixels is smaller than a light receiving area of each of the plurality of first peripheral pixels and a light receiving area of the second central pixel.

18. The image sensor of claim 17, wherein the one first color filter and the one second color filter have a same color.

* * * * *